US011825687B2

(12) United States Patent
Forrest et al.

(10) Patent No.: US 11,825,687 B2
(45) Date of Patent: Nov. 21, 2023

(54) ORGANIC LIGHT EMITTING DEVICE

(71) Applicants: The Regents of the University of Michigan, Ann Arbor, MI (US); The University of Southern California, Los Angeles, CA (US)

(72) Inventors: Stephen R. Forrest, Ann Arbor, MI (US); Yue Qu, Ann Arbor, MI (US); Haonan Zhao, Ann Arbor, MI (US); Mark E. Thompson, Los Angeles, CA (US)

(73) Assignees: The Regents of the University of Michigan, Ann Arbor, MI (US); The University of Southern California, Los Angeles, CA (US)

( * ) Notice: Subject to any disclaimer, the term of this patent is extended or adjusted under 35 U.S.C. 154(b) by 390 days.

(21) Appl. No.: 16/925,777

(22) Filed: Jul. 10, 2020

(65) Prior Publication Data
US 2021/0020867 A1    Jan. 21, 2021

Related U.S. Application Data

(60) Provisional application No. 62/875,296, filed on Jul. 17, 2019.

(51) Int. Cl.
*H10K 50/852*   (2023.01)
*C09K 11/06*    (2006.01)
(Continued)

(52) U.S. Cl.
CPC ............ *H10K 50/852* (2023.02); *C09K 11/06* (2013.01); *H10K 50/11* (2023.02); *H10K 85/371* (2023.02);
(Continued)

(58) Field of Classification Search
None
See application file for complete search history.

(56) References Cited

U.S. PATENT DOCUMENTS 4,769,292 A    9/1988   Tang
5,247,190 A    9/1993   Friend
(Continued)

FOREIGN PATENT DOCUMENTS

CN    112242493    1/2021
EP    1238981      9/2002
(Continued)

OTHER PUBLICATIONS

"High quality factor microcavity OLED employing metal-free electrically active Bragg mirrors" by Genco et al. (Year: 2018).*
(Continued)

*Primary Examiner* — Evren Seven
(74) *Attorney, Agent, or Firm* — Riverside Law LLP

(57) ABSTRACT

An OLED device comprises a substrate, a first electrode positioned over the substrate, a second electrode positioned over the first electrode, at least one emissive layer positioned between the first and second electrodes in a first region of the OLED device, and a multilayer dielectric reflector stack, comprising a plurality of dielectric reflector layers positioned between the substrate and the first electrode, wherein the multilayer dielectric reflector stack is configured to form an optical cavity with the emissive layer having a Purcell Factor of at least 3.

19 Claims, 29 Drawing Sheets

(51) Int. Cl.

| | |
|---|---|
| *H10K 50/11* | (2023.01) |
| *H10K 85/30* | (2023.01) |
| *H10K 101/10* | (2023.01) |
| *H10K 50/13* | (2023.01) |
| *H10K 50/854* | (2023.01) |
| *H10K 59/32* | (2023.01) |
| *H10K 101/30* | (2023.01) |
| *H10K 102/00* | (2023.01) |
| *H10K 59/90* | (2023.01) |

(52) U.S. Cl.
CPC ............... *C09K 2211/1029* (2013.01); *C09K 2211/1044* (2013.01); *C09K 2211/188* (2013.01); *H10K 50/13* (2023.02); *H10K 50/854* (2023.02); *H10K 59/32* (2023.02); *H10K 59/90* (2023.02); *H10K 2101/10* (2023.02); *H10K 2101/30* (2023.02); *H10K 2102/00* (2023.02); *H10K 2102/351* (2023.02)

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,406,801 | B1 | 6/2002 | Tokito |
| 6,468,819 | B1 | 10/2002 | Kim |
| 7,071,615 | B2 | 7/2006 | Lu |
| 7,279,704 | B2 | 10/2007 | Walters |
| 7,431,968 | B1 | 10/2008 | Shtein |
| 7,968,146 | B2 | 6/2011 | Wagner |
| 9,252,378 | B2 * | 2/2016 | Dobbertin ............ H01L 51/5206 |
| 2003/0136959 | A1 * | 7/2003 | Araki .................. H01L 51/5265 257/40 |
| 2003/0230980 | A1 | 12/2003 | Forrest |
| 2004/0174116 | A1 | 9/2004 | Lu |
| 2005/0260449 | A1 | 11/2005 | Walters |
| 2006/0133437 | A1 | 6/2006 | Forrest |
| 2007/0063641 | A1 | 3/2007 | Cok |
| 2008/0233287 | A1 | 9/2008 | Shtein |
| 2008/0237181 | A1 | 10/2008 | Wagner |
| 2009/0135874 | A1 | 5/2009 | Liu |
| 2011/0180757 | A1 * | 7/2011 | Vockic .................. H01L 51/001 438/69 |
| 2013/0026452 | A1 | 1/2013 | Kottas |
| 2013/0107344 | A1 * | 5/2013 | Avouris .............. H01L 31/0352 977/734 |
| 2013/0119354 | A1 | 5/2013 | Ma |
| 2014/0252331 | A1 * | 9/2014 | Oh ....................... H01L 51/5275 156/219 |
| 2015/0008419 | A1 | 1/2015 | Li |
| 2017/0229663 | A1 | 8/2017 | Tsai |
| 2019/0081248 | A1 | 3/2019 | Lin |
| 2019/0131531 | A1 | 5/2019 | Luschtinetz |
| 2019/0157572 | A1 | 5/2019 | Koch |
| 2020/0295307 | A1 | 9/2020 | Fusella |
| 2021/0336161 | A1 | 10/2021 | Xiang |

FOREIGN PATENT DOCUMENTS

| | | |
|---|---|---|
| EP | 3772758 | 2/2021 |
| JP | 2010135467 | 6/2010 |
| KR | 20200110223 | 3/2020 |
| KR | 20210010837 | 1/2021 |
| WO | 2004111066 A1 | 12/2004 |
| WO | 2008044723 | 4/2008 |
| WO | 2008057394 A1 | 5/2008 |
| WO | 2010011390 A2 | 1/2010 |
| WO | 2010111175 | 9/2010 |
| WO | 2013130483 A1 | 9/2013 |

OTHER PUBLICATIONS

Baldo et al, "Transient Analysis of Organic Electrophosphorescence. II. Transient Analysis of Triplet-Triplet Annihilation", Physical Review B, V. 62, No. 16, 2000, pp. 10967-10977.

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett., vol. 75, No. 1, pp. 4-6 (1999).

Celebi, K., Heidel, T. D. & Baldo, M. A. Simplified calculation of dipole energy transport in a multilayer stack using dyadic Green's functions. Opt. Express 15, 1762 (2007).

D. Ha, et al., "Dominance of Exciton Lifetime in the Stability of Phosphorescent Dyes" Advanced Optical Materials 7.21 (2019).

Extended European Search Report for App. No. EP20186321.4, dated Mar. 19, 2021, 12 pages.

Giebink et al., "Intrinsic Luminance loss in Phosphorescent Small-Molecule Organic Light Emitting Devices Due to Bimolecular Annihilation Reactions", Journal of Applied Physics, vol. 103, Issue 4, pp. 044509-044509-9 (2008).

Hamze, et al., "Quick-Silver" from a Systematic Study of Highly Luminescent, TwoCoordinate, d10 Coinage Metal Complexes J. Am. Chem. Soc. 2019, 141, 8616-8626.

Hamze, et al., Science 2019, 363, 601-606.

Jeong, C. et al. Understanding molecular fragmentation in blue phosphorescent organic light-emitting devices. Org. Electron. 64, 15-21 (2019).

Kim, J., et al., Systematic Control of the Orientation of Organic Phosphorescent Pt Complexes in Thin Films for Increased Optical Outcoupling. Advanced Materials 2019, 1900921.

Kim, S.-Y., et al., Organic Light-Emitting Diodes with 30% External Quantum Efficiency Based on a Horizontally Oriented Emitter. Advanced Functional Materials 2013, 23 (31), 3896-3900.

Lee, J. et al. Hot excited state management for long-lived blue phosphorescent organic light-emitting diodes. Nat. Commun. 8, 1-9 (2017).

Liu, Y., et al., All-organic thermally activated delayed fluorescence materials for organic light-emitting diodes. Nature Reviews Materials 2018, 3 (4).

R. Czerwieniec, "Cu(I) complexes—Thermally activated delayed fluorescence. Photophysical approach and material design," Coordination Chemistry Reviews, vol. 325, pp. 2-28, 2016.

Schinabeck, A.; Chen, J.; Kang, L.; Teng, T.; Homeier, H. H. H.; Suleymanova, A. F.; Shafikov, M. Z.; Yu, R.; Lu, C.-Z.; Yersin, H., Symmetry-Based Design Strategy for Unprecedentedly Fast Decaying Thermally Activated Delayed Fluorescence (TADF). Application to Dinuclear Cu(I) Compounds. Chemistry of Materials 2019, DOI: 10.1021/acs.chemmater.9b00671, 13 pages.

Shi, S., et al., Highly Efficient Photo- and Electroluminescence from Two-Coordinate Cu(I) Complexes Featuring Nonconventional N-Heterocyclic Carbenes. J. Am. Chem. Soc. 2019, 141 (8), 3576-3588.

Sim, B., Moon, C. K., Kim, K. H. & Kim, J. J. Quantitative Analysis of the Efficiency of OLEDs. ACS Appl. Mater. Interfaces 8, 33010-33018 (2016).

Uoyama, H., et al., Highly efficient organic light-emitting diodes from delayed fluorescence. Nature 2012, 492 (7428), 234-8.

Zhang, Y., Lee, J. & Forrest, S. R. Tenfold increase in the lifetime of blue phosphorescent organic light-emitting diodes. Nat. Commun. 5, 5008 (2014), 7 pages.

* cited by examiner

| Defect generation mechanism | (i) Unimolecular process | (ii) Triplet-Charge Interaction | (iii) Triplet-Triplet Interaction |
|---|---|---|---|
| Defect generation rate | $\propto G\tau$ | $\propto G^{1.5}\tau$ | $\propto G^2\tau^2$ |
| Excitons quenched by defects | | | |
| Quenching loss | $\propto G\tau^2$ | $\propto \tau$ | $\propto \tau$ |
| $1/LT90$ | $\propto G^2\tau^2$ | $\propto G^{1.5}\tau^2$ | $\propto G^2\tau^3$ |

Fig. 1B

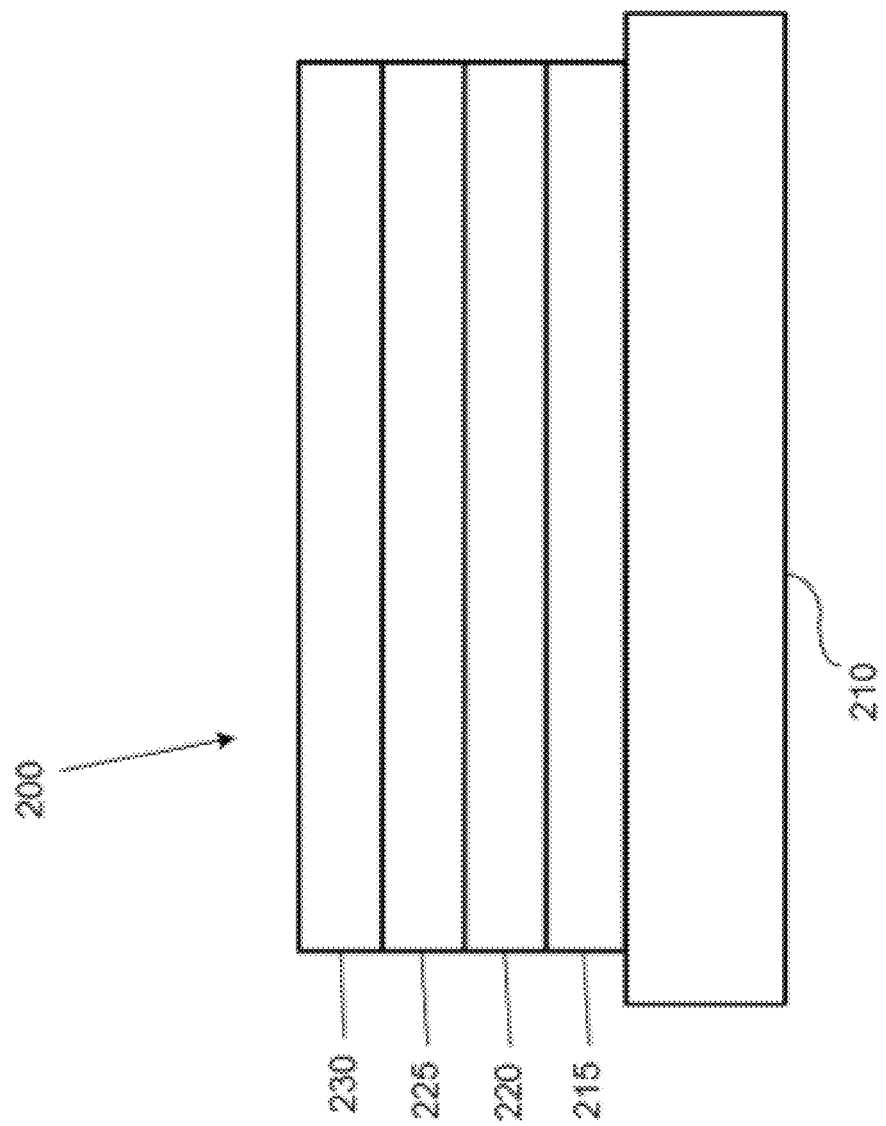

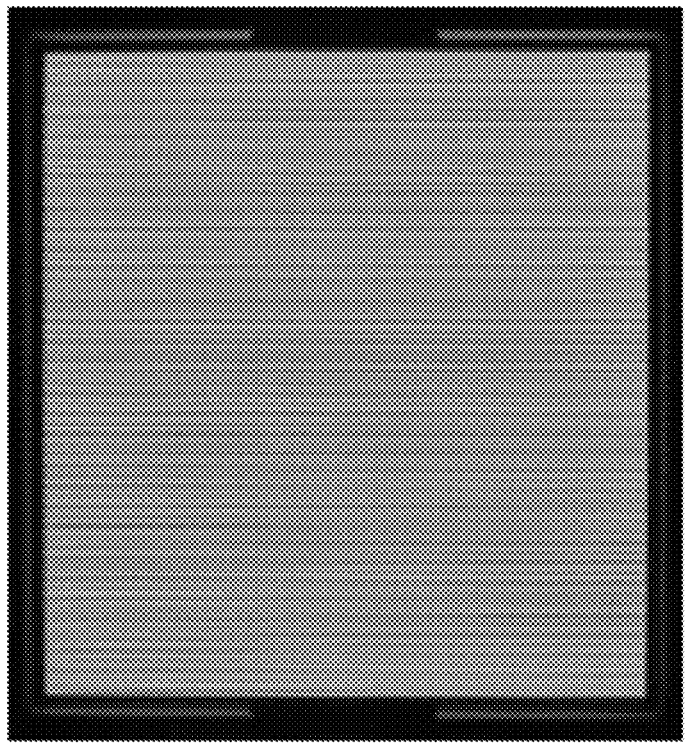
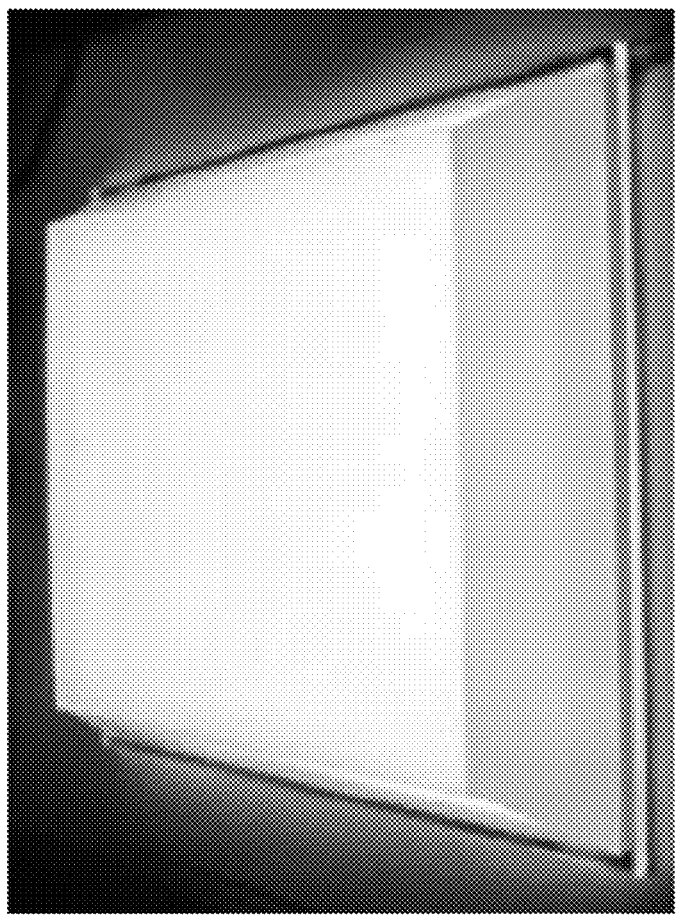
Fig. 4A $$\frac{d(h\nu)}{dt} = k_2 \left(k_1/k_{-1}\right)[T_{III}] = k_2 K_{eq}[T_{III}]$$

$$\tau_{TADF} = \tau_{S_1} K_{eq}^{-1} \qquad \tau_{TADF} = \tau_{S_1} K_{eq}^{-1}$$

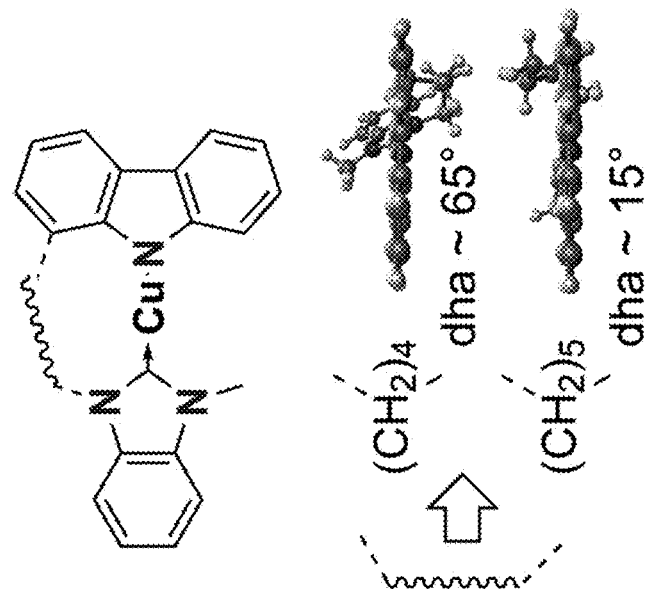
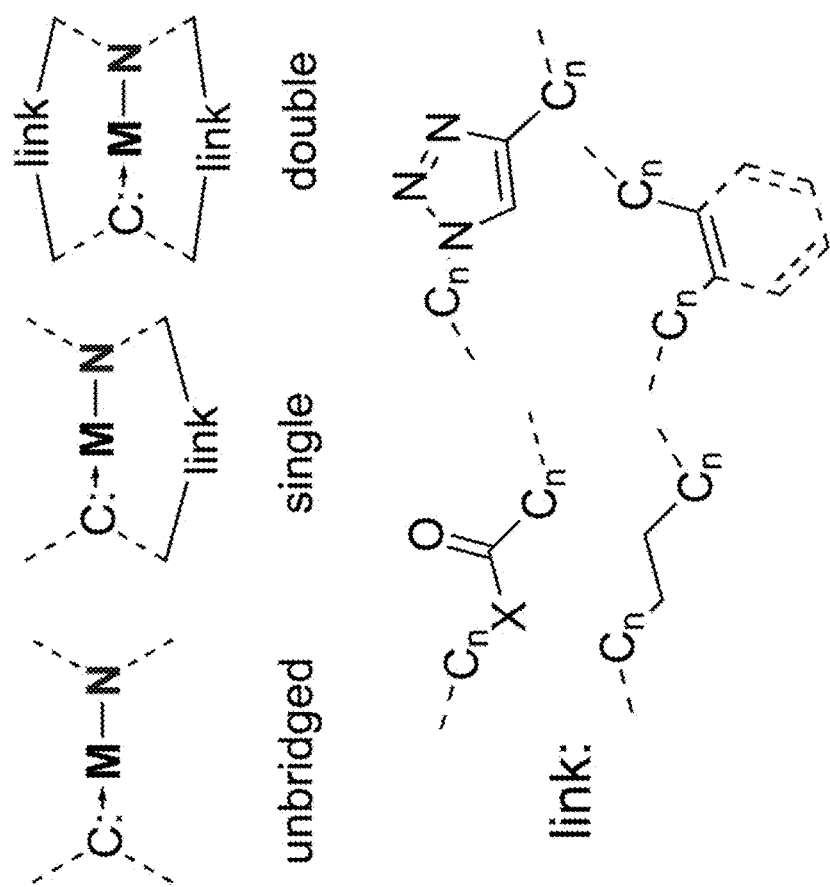
Fig. 12B
Fig. 12A

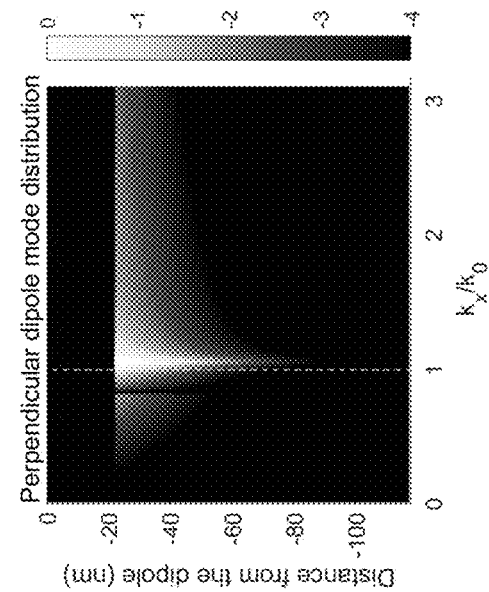
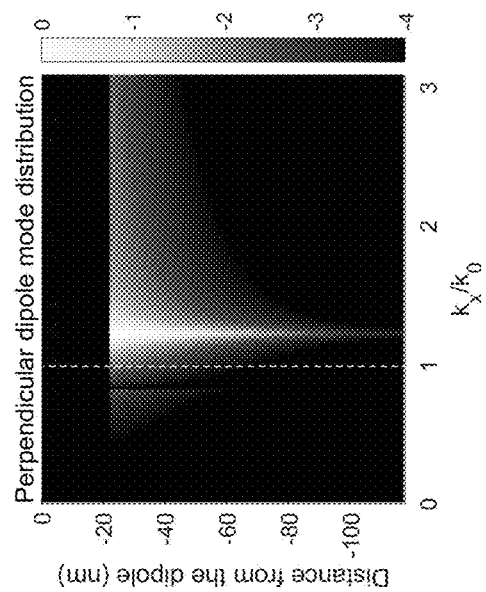
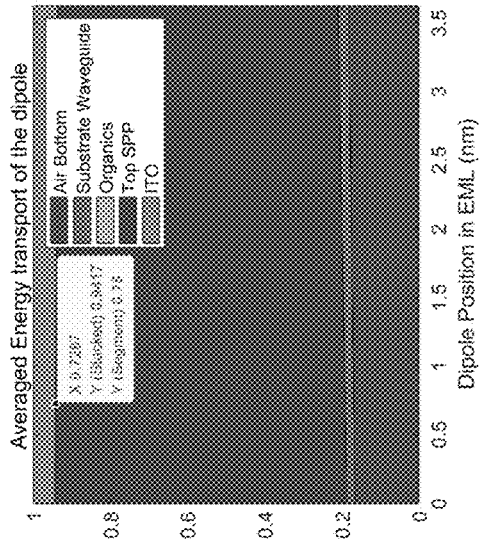
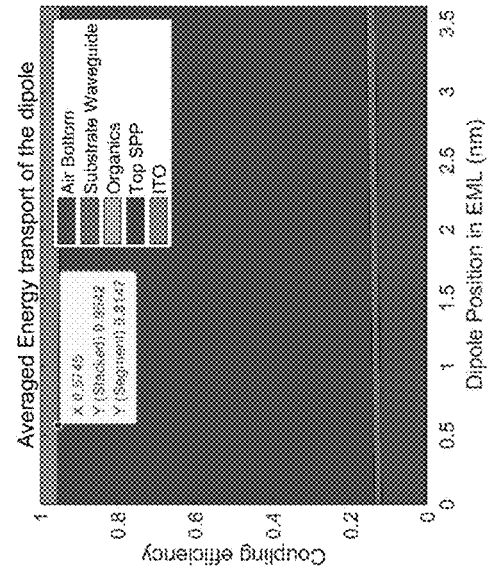
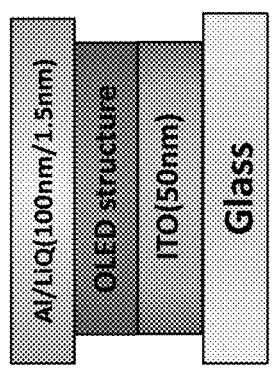
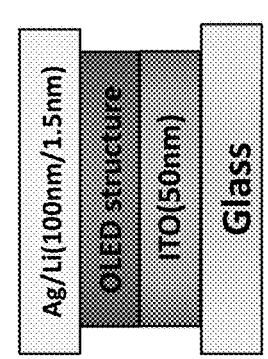
Fig. 21C

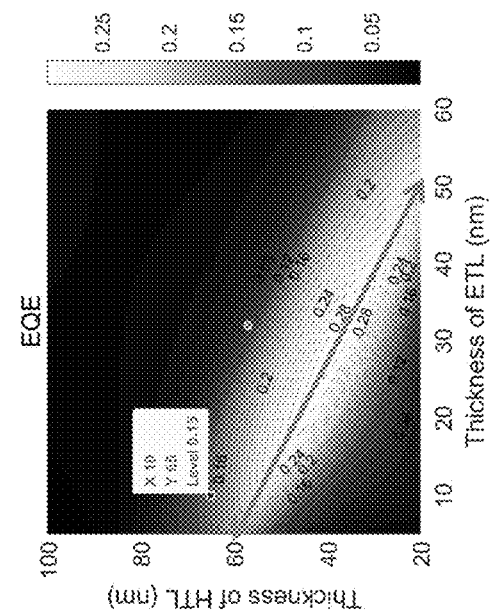
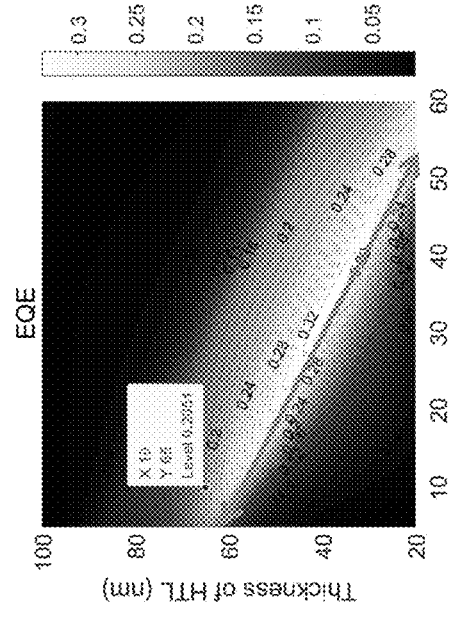
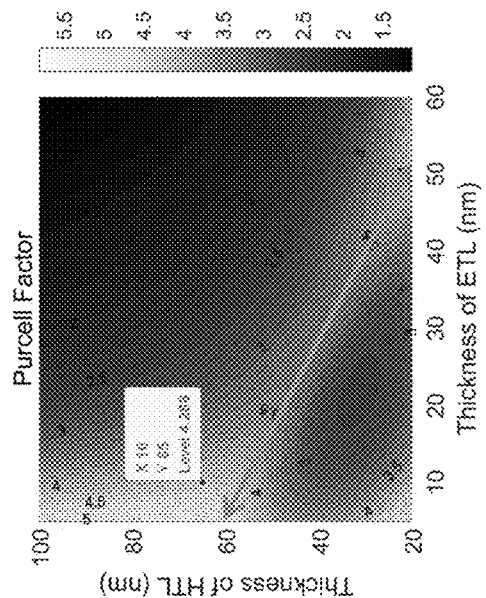
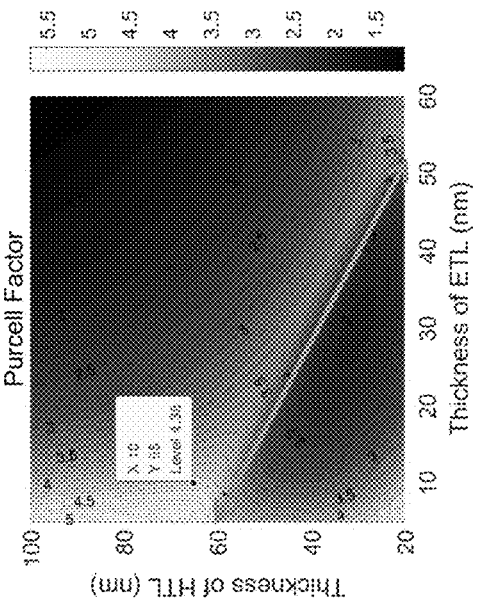
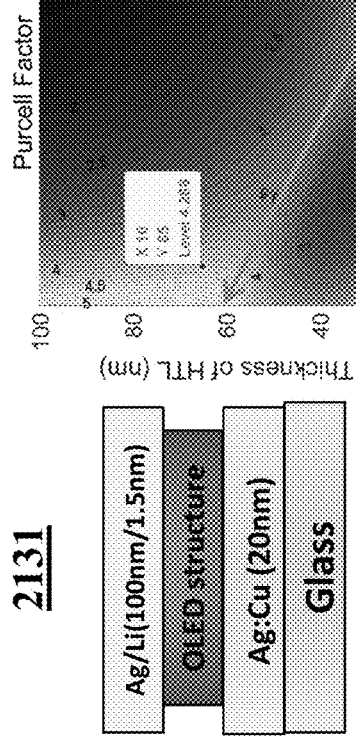
Fig. 21D

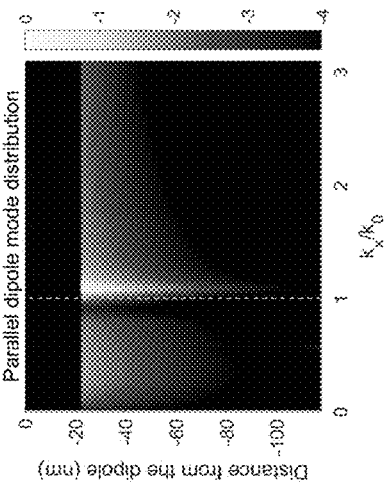
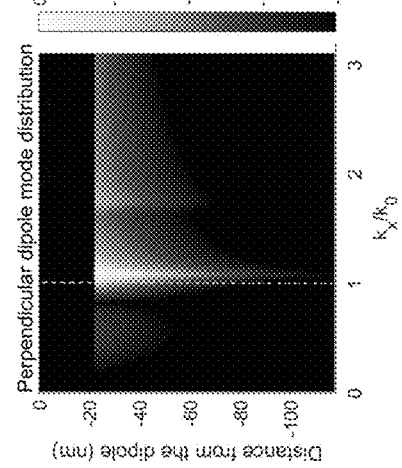
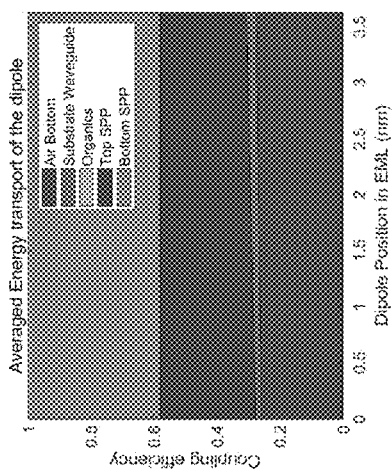
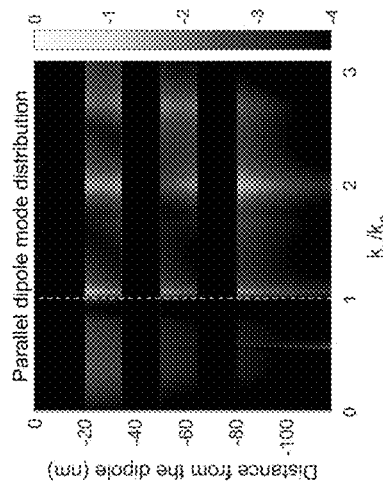
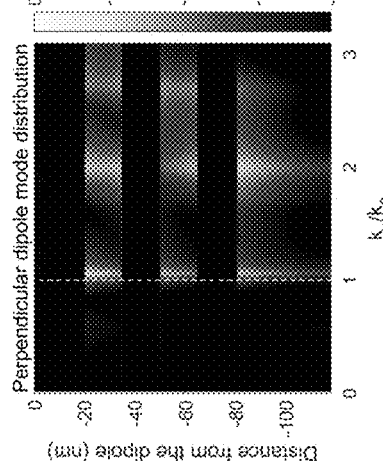
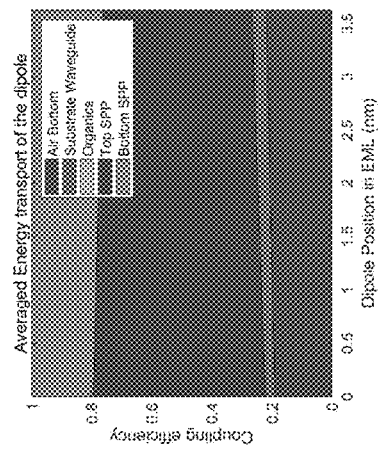
Fig. 21F

ORGANIC LIGHT EMITTING DEVICE

CROSS-REFERENCE TO RELATED APPLICATIONS

This application claims priority to U.S. Provisional Patent Application No. 62/875,296, filed on Jul. 17, 2019, incorporated herein by reference in its entirety.

STATEMENT REGARDING FEDERALLY SPONSORED RESEARCH OR DEVELOPMENT

This invention was made with government support under FA9550-18-1-0162 awarded by the U.S. Air Force. The government has certain rights in the invention.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety. One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

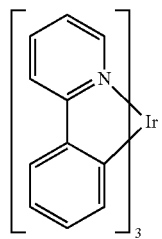

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

One of the most challenging, high value problems facing the field of organic electronics today, and the central challenge facing the implementation of high efficiency white OLED (WOLED) lighting, is to increase the device lifetime of the blue light emitting segments controlled by triplet states. High WOLED efficiencies require utilization of both singlet and triplet excitons, which has involved metalorganic phosphors such as Ir- and Pt-based complexes, and thermally assisted delayed fluorescent (TADF) emitters. All of these materials are characterized by a long-lived triplet-controlled emissive state, with radiative lifetimes extending from ~1 μs to 100 ms. The principal source of molecular degradation leading to the very short blue triplet emitter OLED lifetime is triplet-triplet and triplet-polaron annihilation (TTA and TPA, respectively) shown in FIG. 1A. Two excitons or an exciton and a polaron collide, promoting one to a high energy, or "hot" excited state, while de-exciting the other exciton to its ground state in an Auger-like process. The top graphs 141 show an exemplary triplet-triplet annihilation, while the bottom graphs 142 show an exemplary triplet-polaron annihilation. D denotes the predissociative state. For blue emission, the exciton energy is 2.6-2.8 eV, resulting in a hot excited state whose energy is 5.2-5.6 eV. If localized on a bond, this energy can destroy the molecule, converting it from an emissive state to a non-radiative recombination center. As more emitting molecules are destroyed, the luminance and efficiency of the WOLED decrease, leading to shorter device operational life. Since the probability of bond-breaking is an exponential function of energy, the destruction of red and green organic emitters is at a markedly reduced rate compared to blue, accounting for the comparatively long lifetimes of OLEDs with red or green emitters.

The degradation model is further understood with reference to FIG. 1B, which shows various defect generation mechanisms and their effect on surrounding excitons. Row 151 of FIG. 1B shows graphical representations of defects generated by a unimolecular process, by triplet-charge interaction, or by triplet-triplet interaction, as well as the rate at which each phenomenon generates defects in row 152. As shown in row 153, each defect 154 causes quenching in the surrounding excitons, which leads to loss and further shortens the device lifetime. As illustrated in Equation 1 below, increasing the triplet density ([T]) in the emissive layer increases the rates of TPA and TTA, which in turn increases the defect generation rate, and is inversely proportional to the Purcell Factor ($F_P$).

$$[T] = \frac{G}{F_P k_{R0} + k_{NR} + k_{ET}[D]} \propto F_P^{-1} \qquad \text{Equation 1}$$

For the purposes of Equation 1, $k_{R0}$ is the radiative decay rate in vacuum, $k_{NR}$ is the non-radiative decay rate, $k_{ET}$ is bimolecular quenching rate, and [D] is the defect density. When $k_{NR}$ and $k_{ET}$ are relatively small compared to $k_{R0}$, $F_P$ is roughly inversely proportional to [T]. As shown in Equation 1, as $F_P$ increases, triplet density decreases, which causes decreased defect formation, which in turn increases device operational lifetime.

Numerous strategies have been attempted to mitigate the deleterious effects of TTA and TPA-induced degradation of blue emitting OLEDs that fall into two categories. The first is to reduce the likelihood of TTA/TPA occurring via, for example, lowering exciton density using dopant grading. And the second is to insert "manager" molecules into the emission zone to harmlessly siphon away the hot excited state energy. These methods have led to the longest lived blue phosphorescent OLEDs (PHOLEDs) yet reported, although they have not succeeded in extending the lifetime of blue metalorganic phosphors to $T_{80}$>1500 h. (see Lee, J., et al., Hot excited state management for long-lived blue phosphorescent organic light-emitting diodes. *Nature Commun.* 2017, 8, 15566; and Zhang, Y., et al., Ten-Fold Increase in the Lifetime of Blue Phosphorescent Organic Light Emitting Diodes. *Nature Commun.* 2014, 5, 5008, both incorporated herein by reference).

One existing device, the OLEDWorks Brite3, claims high $T_{70}$ at a high $L_0$. However, the product in question combines fluorescent blue with phosphorescent green and red sub-elements. Hence the efficiency is below that which can be achieved using all-phosphorescent/TADF approaches proposed herein. Having both high efficiency and lifetime can only be achieved using three color emitting sub-elements that have 100% internal quantum efficiency.

SUMMARY

In one aspect, an OLED device comprises a substrate, a first electrode positioned over the substrate, a second electrode positioned over the first electrode, at least one emissive layer positioned between the first and second electrodes in a first region of the OLED device, and a multilayer dielectric reflector stack, comprising a plurality of dielectric reflector layers positioned between the substrate and the first electrode, wherein the multilayer dielectric reflector stack is configured to form an optical cavity with the emissive layer having a Purcell Factor of at least 3.

In one embodiment, the device further comprises a hole transport layer between the emissive layer and the first electrode. In one embodiment, the device further comprises an electron transport layer between the emissive layer and the second electrode. In one embodiment, the multilayer dielectric reflector stack comprises alternating layers of first and second metal compounds. In one embodiment, the first metal compound is $TiO_2$ and the second metal compound is $MgF_2$. In one embodiment, the alternating layers of $TiO_2$ and $MgF_2$ consists of two layers of $TiO_2$ and two layers of $MgF_2$. In one embodiment, at least one layer of the layers of the first metal compound has a thickness that is different than a thickness of at least one other layer of the layers of the first metal compound.

In one embodiment, the second electrode is a transparent cathode. In one embodiment, the first electrode is a semi-transparent anode. In one embodiment, the emissive layer is a blue emissive layer. In one embodiment, the device further comprises a second multilayer reflector stack positioned over the second electrode. In one embodiment, the second multilayer reflector stack comprises alternating layers of metal and dielectric. In one embodiment, the device further comprises a second region, the second region comprising a second emissive layer having a peak emission wavelength different from a peak emission wavelength of the emissive layer in the first region. In one embodiment, the peak emission wavelength of the second emissive layer is selected from the group consisting of a red emission wavelength, a green emission wavelength, and a yellow emission wavelength. In one embodiment, the device further comprises a diffuser positioned over the second electrode, configured to mix light emitted from the first region and the second region of the OLED device.

In another aspect, an OLED device comprises a substrate, a first electrode positioned over the substrate, a second electrode positioned over the first electrode, and at least one emissive layer positioned between the first and second electrodes in a first region of the OLED device, wherein the at least one emissive layer comprises a cMa compound. In one embodiment, the cMa compound comprises a metal atom selected from the group consisting of: copper, silver, and gold in any oxidation state possible for the particular metal atom. In one embodiment, the cMa compound comprises a carbene having the structure

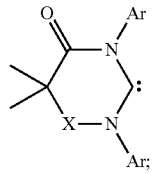

wherein X represents $CH_2$ or $C=O$, and each Ar independently represents a phenyl group, preferentially substituted in the 2- and 6-positions with alkyl groups, such as methyl, ethyl or isopropyl.

In one embodiment, the cMa compound comprises an amide selected from the group consisting of

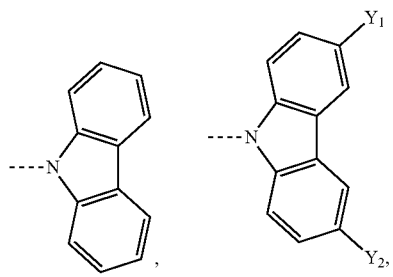

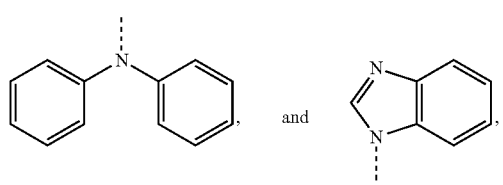

wherein $Y_1$ and $Y_2$ each independently represent H or CN, and the dashed bond represents a bond from the amide to the metal of the cMa compounds.

In one embodiment, the cMA compound is

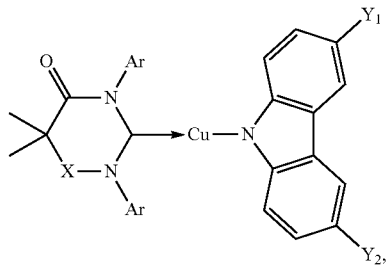

wherein "⟶" represents a bond from the carbene to the metal of the cMa compound, X represents $CH_2$ or $C=O$, $Y_1$ and $Y_2$ each independently represent H or CN, and each Ar independently represents a phenyl group, preferentially substituted in the 2- and 6-positions with alkyl groups, such as methyl, ethyl or isopropyl.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which:

FIG. 1B is a diagram showing various defect generation mechanism and the effect of defects on surrounding excitons and device lifetime.

FIG. 3 shows an inverted organic light emitting device that does not have a separate electron transport layer;

FIG. 4A shows a panel consisting of R, G, B stripes positioned side-by-side. All stripes in left image are on, and on the left, the 15×15 cm panel is attached to a plastic block diffuser showing white illumination.

FIG. 12A shows macrocyclic forms of (carbene)M(amide) to bridge ligands. X=O, NR and $C_n$ is —$(CH_2)_n$—.

FIG. 12B shows benzimidazolylcarbene (BzI) cMa with n=4 and 5.

FIG. 21C shows two structures and graphs of corresponding energy transport and dipole mode distribution.

FIG. 21D shows two structures and graphs of corresponding simulated Purcell Factor and EQE calculations.

FIG. 21F shows graphs of energy transport and dipole mode distribution.

DETAILED DESCRIPTION

Figure 1A:
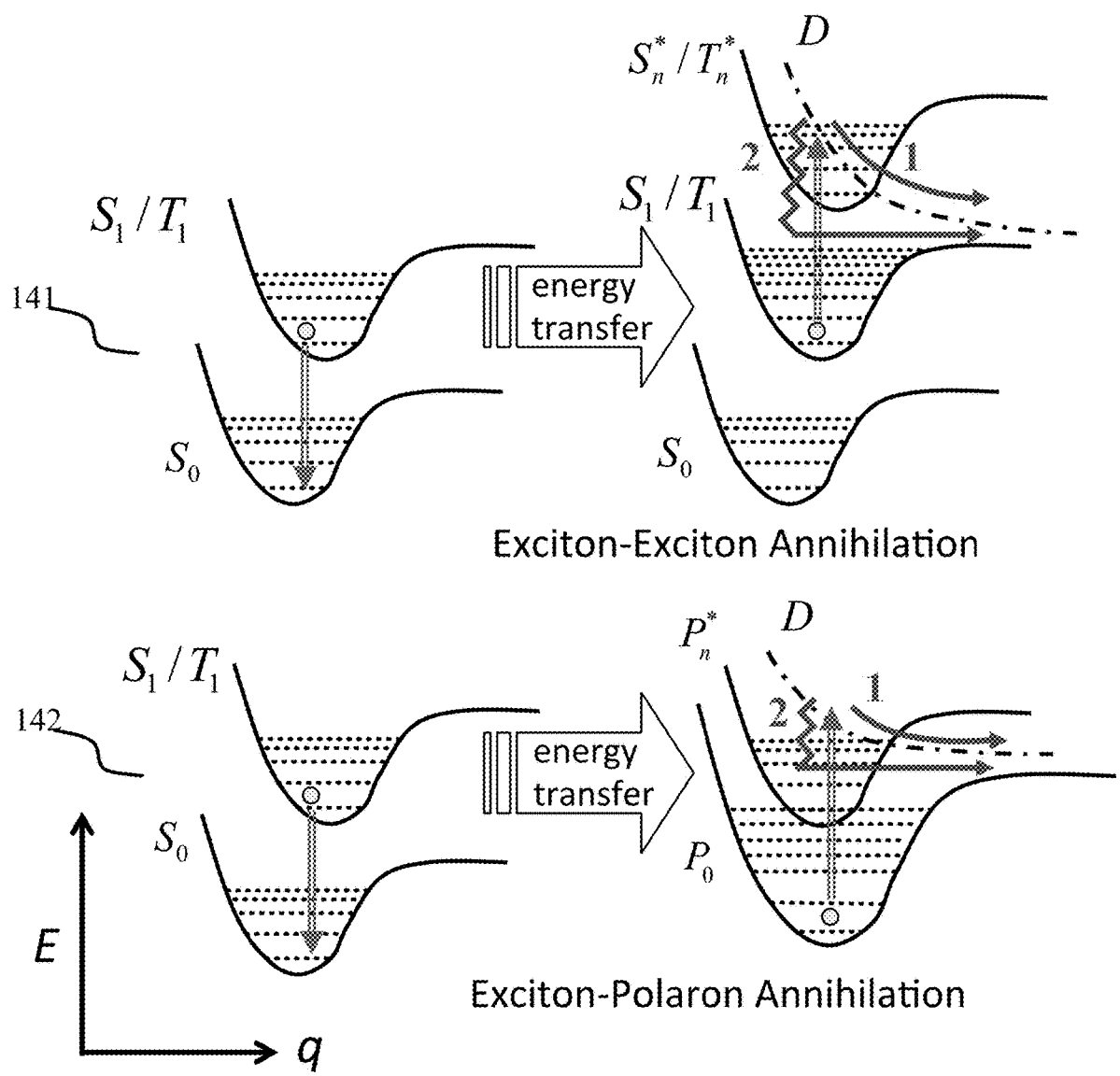
FIG. 1A shows graphs of molecular dissociation kinetics due to triplet-triplet and triplet-polaron annihilation.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

Throughout this disclosure, various aspects can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 2:
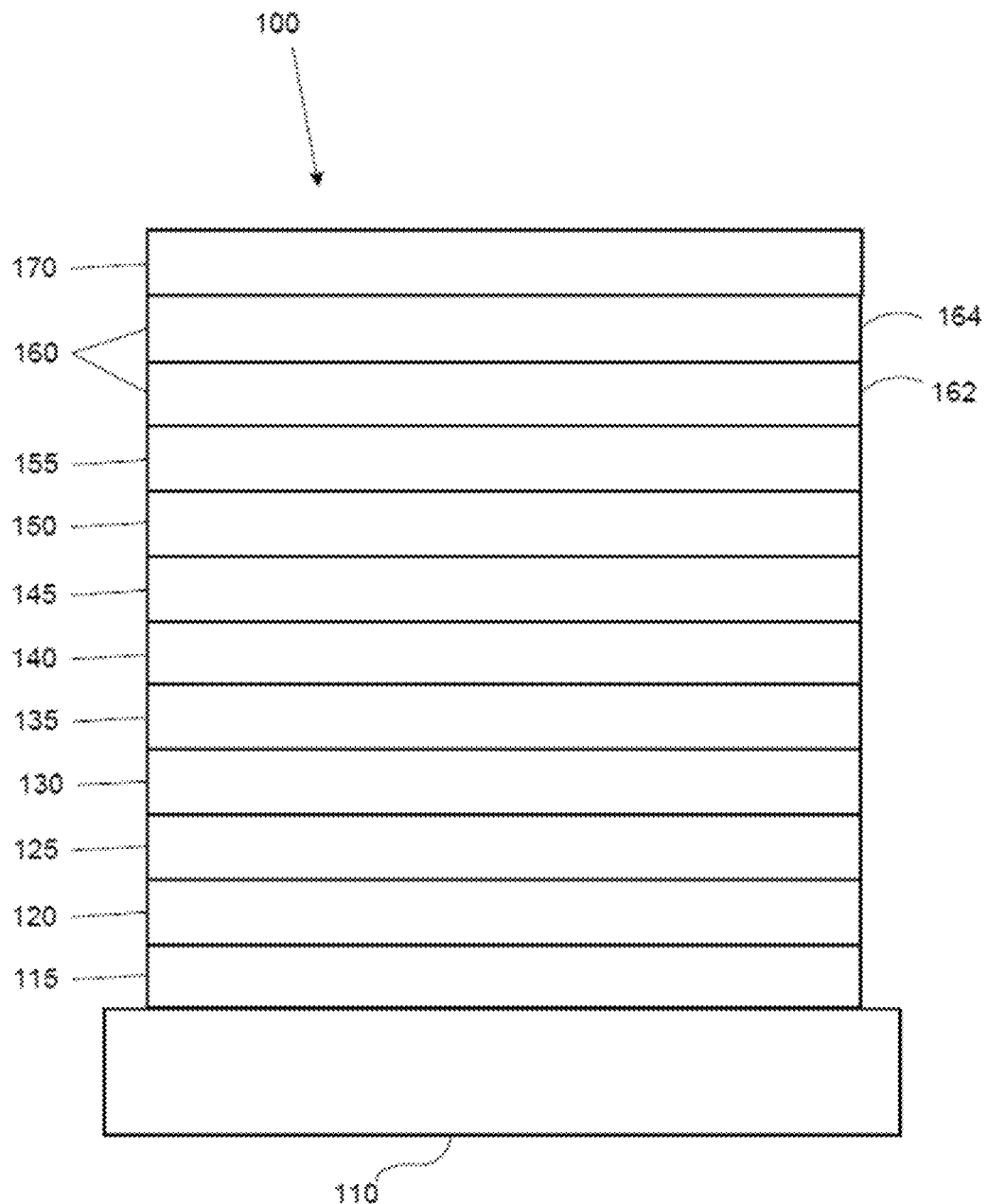
FIG. 2 shows an organic light emitting device.

FIG. 2 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

FIG. 3 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 3 provides one example of how some layers may be omitted from the structure of device 100.

The simple layered structure illustrated in FIG. 2 and FIG. 3 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 2 and FIG. 3.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 2 and 3. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

In various embodiments, the present disclosure includes light-emitting devices and methods for producing light-emitting devices having a long device operational lifetime (in some embodiments, $T_{70}$ is at least 50,000 hours, at least 45,000 hours, at least 40,000 hours, or at least 60,000 hours) while also having a high initial luminance (in some embodiments, $L_0$ is at least 3000 cd/m$^2$, or at least 4000 cd/m$^2$, or at least 2000 cd/m$^2$, or at least 2500 cd/m$^2$), and a high external quantum efficiency (EQE in certain embodiments may be at least 12%, at least 15%, at least 18%, at least 20%, at least 22%, or at least 25%). In some embodiments, a device of the disclosure may have 100% or near 100% internal efficiency. Although the described methods and devices may be presented in the context of white OLED emitting devices (referred to herein as WOLED devices), it is understood that the methods and improvements described herein may also be used to produce improved OLED devices of other colors, improved OLED displays, or any other suitable devices.

In one aspect, the present disclosure includes methods of reducing TTA- and TPA-induced device degradation in one or more emissive materials, for example blue emissive materials in an OLED emissive stack. The present disclosure also includes devices designed to reduce TTA- and TPA-induced degradation.

A blue emissive device may be combined in some embodiments with red, green, or yellow emissive devices to form a WOLED device. In one embodiment, the blue emissive device is fabricated on a first substrate, and a transparent red/green (R/G) stacked device is fabricated on a second substrate. The first and second substrates may then be sealed together to form a stacked packaged device. A device fabricated in accordance with this embodiment may be a two-terminal device or a three-terminal device, wherein some embodiments a top contact of the blue and R/G devices are shorted.

Figure 4B:
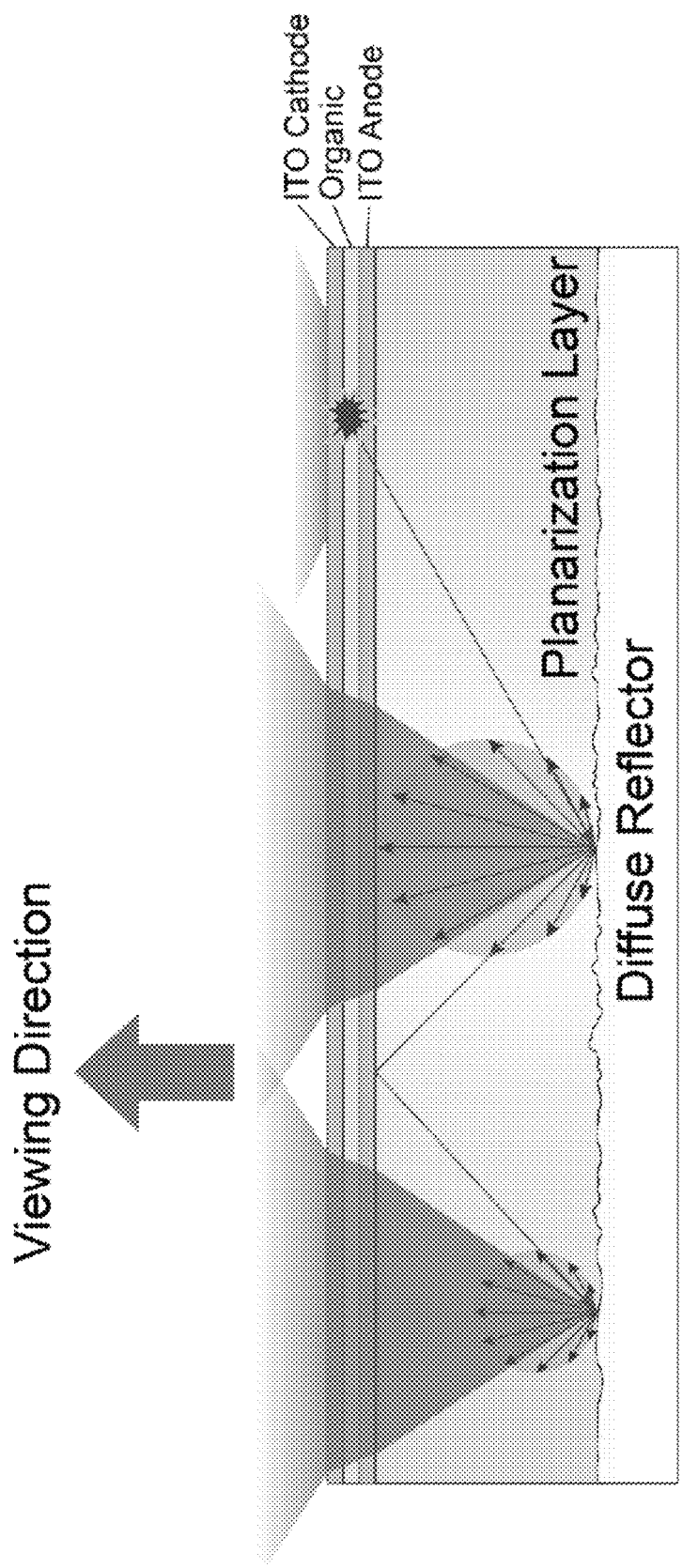
FIG. 4B shows an alternative, very low-profile diffuser with high outcoupling efficiency employing OLEDs grown on a rough Teflon diffuse reflector. This device has EQE>40%.

Another compatible structure for generating white light using PF enhancements is by placing R, G and B OLEDs side-by-side in stripes. This WOLED configuration can result in 100% efficiency of each individual color, as well as white light color tunability by providing two, three or four contacts (the latter to each color stripe component). In some embodiments, a WOLED device may include a diffuser, configured to mix the colors in the far field. In some embodiments, the diffuser can be integrated onto the device itself. An exemplary WOLED device with a side-by-side arrangement is shown in FIG. 4A, with the bare device 401 and with a diffuser 402. An alternative embodiment with an integrated diffuser is shown in FIG. 4B. This configuration places a blue emitting stripe (~1 mm wide) whose lifetime is increased by PF management, adjacent to an element emitting R and G via a stacked or mixed emission zone OLED. The stripes may in some embodiments be connected in parallel. The architecture eliminates microcavity effects by use of an optical diffuser, and the efficiency of each color emitting element is individually optimized. In some embodiments, multiple blue elements may be used for increased brightness, although in some embodiments only a single blue element combined with 2-4 red and green elements is needed for appropriate white color balance. This architecture is simple to fabricate and allows the use of PF enhancements without complicating the device architecture. In some embodiments, a device comprises one each of a blue, red, and green emissive element. In some embodiments, a device comprises one each of a blue and yellow emissive element. In some embodiments, a device comprises two each of a blue, red, and green emissive element. In some embodiments, a device comprises one blue element and two each of green and red emissive elements. In some embodiments, a device comprises two blue elements and three each of red and green emissive elements.

The improvements and methods described herein fall roughly into two categories. First, in some embodiments, the optical cavity for one or more emitters is shaped to shorten the radiative lifetime of the emitting molecules, thereby reducing exciton density in the OLED emission zone, which in turn reduces the probability that an exciton will encounter another exciton or polaron, leading to reduced likelihood of damage to an emissive molecule via a high-energy degradation event, as described above. The disclosed improvement therefore increases the stability, and therefore the device operational lifetime, by decreasing the radiative emission lifetime. As described herein, the Purcell Factor (PT) refers to the ratio of the total radiative rate ($k_r$) of a phosphor to the natural radiative rate of the phosphor (i.e. $k_{r0}$, in free space).

Optical cavity manipulation includes manipulation of emissive material lifetime with the Purcell effect, i.e., creating optical environments that reduce the lifetime by coupling a high density of OLED optical modes with the excitonic state. Because the Purcell effect couples the radiative state of the emitter to the ground state, it is in some embodiments effective in reducing the phosphorescent radiative lifetime in metalorganic compounds. However, optical cavity manipulation is less effective in accelerating the emission rate of all-organic TADF molecules whose emission is from the singlet, whereas the lifetime (and hence probability for exciton annihilation) is determined by the very slow equilibration of the dark triplet state with the emissive singlet. In effect, the TADF process uses the triplet state as a reservoir, or "capacitor" that stores energy. However, using metalorganic TADF molecules as described herein, the triplet and singlet states are in rapid thermal equilibrium, leading to very short radiative lifetimes that are in some embodiments further shortened by manipulation of the optical environment.

In one embodiment, the triplet is an emitting dipole embedded in a photonic structure that enhances the interaction between the electrical field and the dipole. With the dipole radiative decay rate largely increased, the triplet density is reduced accordingly.

In some embodiments, a radiative lifetime of an emissive material is modified by decreasing or increasing the number of optical modes available to the emission.

Embodiments of the disclosure using a tuned or manipulated optical cavity may therefore be used for PHOLEDs, for example blue PHOLEDs.

In one embodiment, the radiative lifetime of an emissive material is adjusted by increasing or decreasing the distance between an emissive layer and an electrode, for example a silver cathode, as discussed in D. Ha, et al., "Dominance of Exciton Lifetime in the Stability of Phosphorescent Dyes" *Advanced Optical Materials* 7.21 (2019), incorporated herein by reference.

In one embodiment, the conventionally used top metal cathode (which may for example comprise silver or aluminum) in a bottom-emitting OLED is replaced with metal-dielectric alternating layers to maximize the SPP mode coupling, thus enabling a fast triplet decay rate and increasing the Purcell factor. In one embodiment, the bottom indium tin oxide (ITO) layer is replaced with metal-dielectric layers to increase the reflectivity of the anode, in order to compensate for the outcoupling efficiency loss and enhance the cavity effect. In one embodiment, such a structure may be configured to achieve a high Purcell factor, for example about 5, and approximately reduce the triplet density to one-fifth of that of a conventional device. Because of the inverse relationship between triplet density and operational lifetime as discussed above, the operational lifetime is in some embodiments prolonged by the same multiple as the triplet density is reduced. Moreover, the disclosed structure is engineered outside the emission region, so it could be employed together with other techniques disclosed herein.

Figure 5:
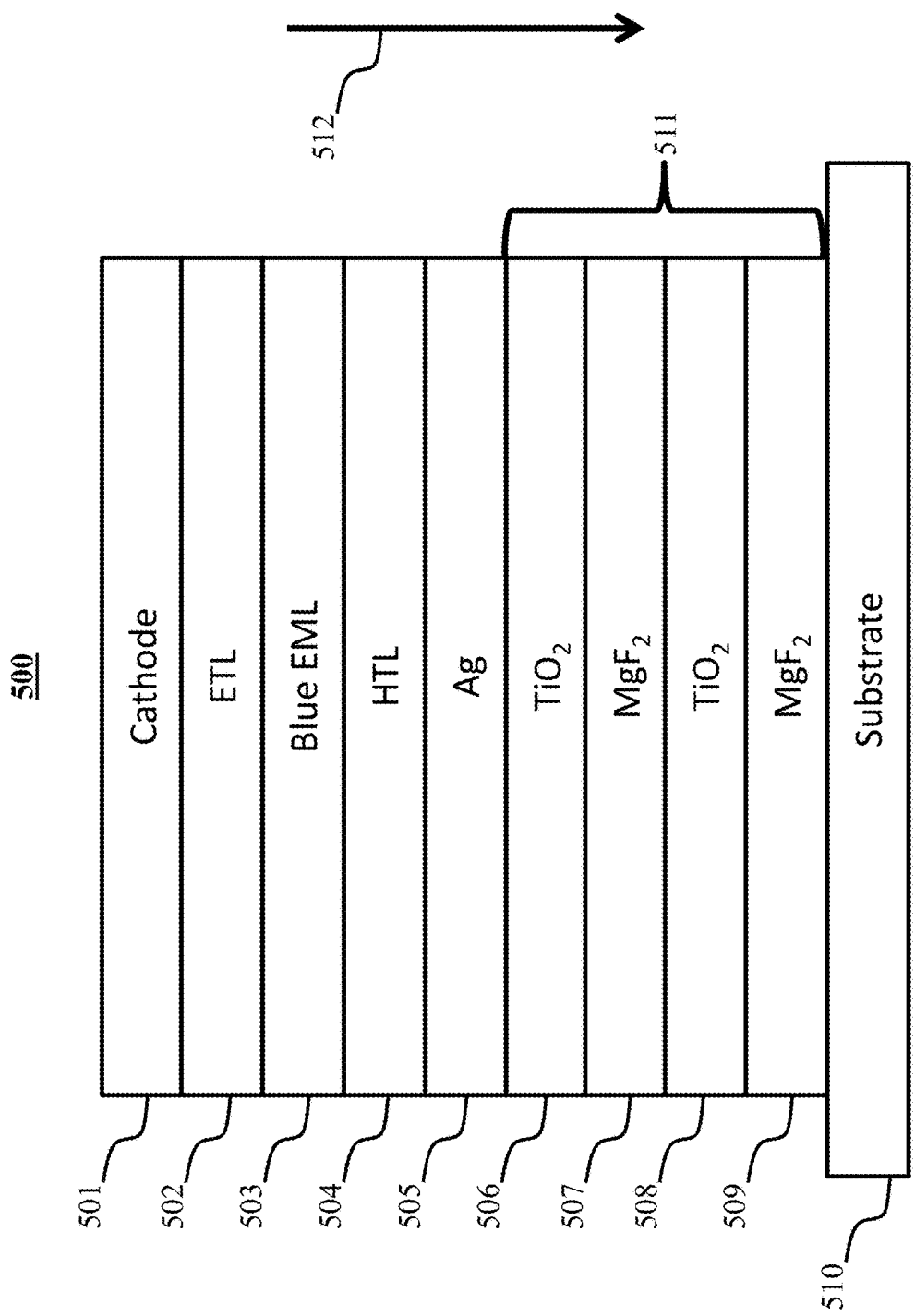
FIG. 5 shows a PHOLED structure with two metal contacts.

One exemplary blue PHOLED is shown in device 500 of FIG. 5. In the depicted embodiment, the mode density and electric field may be modified by changing the dimensions of the optical cavity of the OLED, as well as by the orientation of the transition dipole moment relative to the substrate 510 and/or contacts (501, 505) as discussed below. FIG. 5 may in some embodiments be a blue emitting PHOLED with two metal contacts, cathode 501 and anode 505. The emitting side may be adjacent to the surface of a multilayer dielectric reflector 511, which in the exemplary diagram comprises alternating layers of $TiO_2$ and $MgF_2$ (506-509). The metal cavity encourages coupling to surface plasmon polariton (SPP) modes, thereby greatly increasing $\rho_{ph}$ compared to conventional OLEDs. The dielectric stack 511 supports transverse electric waveguide modes that are extracted into the emitting direction 512. In one exemplary embodiment of FIG. 5, the emission wavelength from emissive layer 503 is 450 nm, and the layers have the following thicknesses: electron transport layer 502 has a thickness of 45 nm, hole transport layer 504 has a thickness of 40 nm, silver anode 505 has a thickness of 15 nm, metal layer 506 has a thickness of 60 nm, metal layer 507 has a thickness of 80 nm, metal layer 508 has a thickness of 49 nm, and metal layer 509 has a thickness of 80 nm. In some embodiments, layer thicknesses should be configured to generate a maximum value of an electric field in the emission layer.

In one embodiment, reducing triplet density in the emission layer (EML) or siphoning out the "hot" excited states can slow down the degradation process. Previous studies show that using graded doping, triplet density follows a flattened distribution curve in the EML, resulting in T80=213 h (time to 80% of the 1,000 cd m$^{-2}$ initial luminance) for a graded single device, and T80=616 h for a graded stacked device, about a tenfold increase compared to an ungraded single device. Moreover, by positioning manager molecules in the triplet-dense region, the hot states rapidly thermalize before damaging organic molecules, resulting in T80=334 h, about tenfold improvement over a conventional blue PHOLED.

In some embodiments, an emissive layer of a device of the disclosure may be a blue emissive layer, including but not limited to a phosphorescent blue emissive layer. Suitable blue emitting phosphors include, but are not limited to, tris[3-(2,6 dimethylphenyl)-7-methylimidazo[1,2-f] phenanthridine] iridium (III) (Ir(dmp)$_3$), bis[2-(4,6-difluorophenyl)pyridinato-C2,N](picolinato)iridium(III), tris-(N-phenyl,N-methyl-pyridoimidazol-2-yl)iridium(III), tris-(N-phenyl,N-methyl-pyrazinoimidazol-2-yl)iridium(III), tris[2-(4,6-difluorophenyl)-4-alkoxy-pyridinato-C2,N](picolinato) iridium(III), or bis(4,6-difluorophenylpyridinato)(5-(pyridin-2-yl)-tetrazolate)iridium(III). In certain embodiments, a blue phosphor may have a lifetime of lifetime of $T_{80}$=620 h at $L_0$=1000 cd/m$^2$, for example when arranged as a graded EML in a double-stacked blue PHOLED, and may have a $T_{80}$ of 1500 h when a manager is added. In some embodiments, an emissive layer may further comprise a host material, for example a 4,4'-bis(9-carbazolyl)-1,1'-biphenyl (CBP) host. In some embodiments, a disclosed device with a modestly enhanced PF=5, including the additional EQE that accompanies this enhancement, and when further modified by some or all of the methods discussed herein, has lifetime of approximately 10,000 h for the blue element in a stacked PHOLED dominated by TPA, or 40,000 h if TTA is dominant. Additionally, because only 25% of the light for a WOLED is demanded from the blue segment, a disclosed WOLED device including a disclosed blue PHOLED may have a device lifetime of at least 40,000 h at a white light $L_0$=3000 cd/m$^2$ where degradation is dominated by TPA.

In some embodiments, an emissive layer of a device of the present disclosure may be a graded emissive layer. As used herein, the term "graded layer" refers to a layer comprising more than one material having a concentration gradient across the thickness of the layer. A "graded emissive layer" is a graded layer comprising one or more emissive materials. In some embodiments, a graded layer has two materials, each having a continuous concentration gradient across the thickness of the layer, with the gradients oriented in opposite directions. For example, in one embodiment, a graded layer comprises first and second materials, wherein the first material increases in concentration across the thickness of the layer in one direction, while the second material decreases in concentration across the thickness of the layer in the same direction.

A gradient as disclosed herein may be described as a continuous volumetric concentration gradient, where the volumetric concentrations of at least two materials vary along an axis within a layer. Gradients may be defined by a variety of parameters, for example the concentrations of each of the materials at either end of the gradient, as well as the rate of change of concentration along the axis of the gradient. In some embodiments, volumetric concentrations along an axis of a gradient may follow a linear, parabolic, logarithmic, or any other mathematical definition along the gradient axis. In some embodiments, a continuous volumetric concentration gradient may be a variable gradient, meaning that the gradient may be divided up into multiple segments, wherein at least one segment of the gradient follows a different mathematical definition from at least one other segment of the gradient. In one example, a continuous volumetric concentration gradient may extend halfway through the graded layer (a first segment) with volumetric concentration of two materials changing at a linear pace along the gradient axis, then after the midway point of the graded layer (the second segment), proceed at a parabolic rate until the opposite end of the graded layer.

Another method for increasing PF, and therefore to decrease the radiant lifetime of a material is via molecular dipole orientation, which additionally may result in increased light outcoupling efficiency (see Kim, S.-Y., et al., Organic Light-Emitting Diodes with 30% External Quantum Efficiency Based on a Horizontally Oriented Emitter. *Advanced Functional Materials* 2013, 23 (31), 3896-3900; and Kim, J., et al., Systematic Control of the Orientation of Organic Phosphorescent Pt Complexes in Thin Films for Increased Optical Outcoupling. *Advanced Materials* 2019, 1900921, both of which are incorporated by reference). Methods may include aligning the transition dipole moment either parallel or perpendicular to the substrate plane. In some embodiments, parallel dipole alignment results in a larger increase in PF than perpendicular alignment. Methods of the disclosure may include the steps of manipulating the properties of one or more dipole materials to align the dipole moments, or to build a device of the disclosure with one or more layers having a material with molecular dipoles already aligned or substantially aligned. In some embodiments, a device of the disclosure may include one or more layers with the molecular dipoles aligned in a first direction, for example in a direction parallel to a substrate, while also including one or more layers with their molecular dipoles aligned in a second direction, for example in a direction perpendicular to a substrate.

In some embodiments, any dielectric or pair of dielectrics may be use that have good index contrasts, including but not limited to polymers, glasses, or any material which has high reflectivity. In some embodiments, a dielectric material may be chosen and configured such that the dielectric material has a dipole moment vertical (perpendicular) relative to the surface of the substrate. In some embodiments, one or more methods applied alone or in combination to one or more materials of a device of the disclosure may result in a PF of at least 3, at least 5, at least 8, at least 9, at least 10, or more.

A second improvement which may be used separately or in combination with the first is to increase the emission rate through use of metalorganic TADF molecules, for example molecules having a metal linker between the intramolecular donor and acceptor groups. Suitable metals include, but are not limited to, Au, Ag, and Cu. Emission lifetimes for even the most efficient pure organic phosphors are typically >2 μs. By contrast, metalorganic TADF molecules as disclosed herein may have a radiative emission lifetime of shorter than 500 ns, shorter than 350 ns, shorter than 200 ns, or shorter than 100 ns. Converting an existing donor/acceptor pair into a metalorganic material by use of a metal linker may in some embodiments modify the intramolecular charge transfer dynamic of the transition. Metalorganic materials as disclosed herein may have an ultrafast equilibration between singlet and triplet manifolds not found in fully organic TADF molecules. This feature may be referred to interchangeably herein as a reduction in the singlet-triplet energy gap or exchange energy. Such metalorganic molecules may have their radiative emission lifetimes reduced further by combining their use with the optical cavity designs disclosed herein.

In some embodiments, an emissive material as contemplated herein may comprise a donor molecule, an acceptor molecule, and one or more metal atoms linking the donor and acceptor molecules. In one embodiment, at least one donor material and at least one acceptor material form at least one heterojunction. The dissociation of an exciton will typically occur at the "heterojunction" formed by the juxtaposition of donor and acceptor materials. In some embodiments, the heterojunction is chosen from a mixed heterojunction, a bulk heterojunction, a planar heterojunction, a nanocrystalline-bulk heterojunction, and a hybrid planar-mixed heterojunction. The donor and acceptor materials may be deposited by at least one technique chosen from, for example, vacuum deposition, spin coating, organic vapor-phase deposition (OVPD), inkjet printing, and vacuum thermal evaporation (VTE).

The acceptor molecule can be any acceptor molecule known to a person of skill in the art. In one embodiment, the acceptor molecule is a carbene. The carbene can be any carbene known to a person of skill in the art. In one embodiment, the carbene is one the following structures:

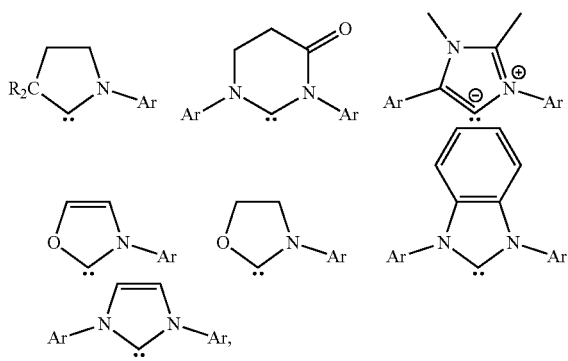

wherein $R_2$ is an alkyl or aryl group. The aryl groups (Ar) are preferentially substituted in the 2- and 6-positions with alkyl groups, such as methyl, ethyl or isopropyl.

In one embodiment, the acceptor molecule is a carbene having the following structure:

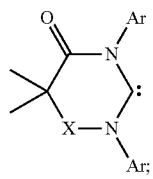

wherein:
X represents $CH_2$ or $C\!=\!O$; and
each Ar independently represents a phenyl group, preferentially substituted in the 2- and 6-positions with alkyl groups, such as methyl, ethyl or isopropyl.

The donor molecule can be any donor molecule known to a person of skill in the art. Suitable donor molecules include, but are not limited to, N-carbazolyl, dialkylamino, diarylamino, N-benzimidazolyl, alkoxide, aryloxide, thioalkyl and thioaryl. In one embodiment, the donor molecule comprises an amide. In one embodiment, the donor molecule comprises an amine. In one embodiment, the donor molecule is carbazole. In one embodiment, the donor molecule is diphenylamine. In one embodiment, the donor molecule is

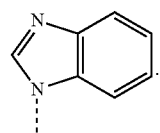

In one embodiment, the donor molecule is an optionally substituted carbazole molecule or diphenylamine molecule. In one embodiment, the optionally substituted carbazole is substituted with one or more CN groups. In one embodiment, the optionally substituted carbazole is substituted with two CN groups.

In one embodiment, the donor molecule and the acceptor molecule are linked through a metal atom. The metal atom can be any metal atom known to a person of skill in the art. In one embodiment, the metal atom is copper, silver, or gold in any oxidation state possible for the particular metal. In one embodiment, the metal atom links a carbene acceptor and an amide donor to form a cMA compound. In one embodiment, the metal atom links a carbene acceptor and an amine donor to form a cMA compound. In one embodiment, the cMA compound is

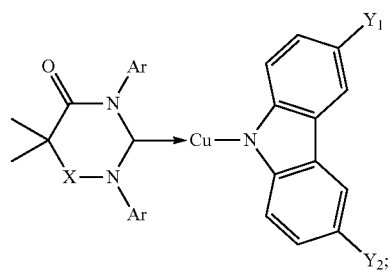

wherein:
"$\longrightarrow$" represents a bond from the carbene to the metal of the cMa compound;
X represents $CH_2$ or $C\!=\!O$;
$Y_1$ and $Y_2$ each independently represent H or CN; and
each Ar independently represents a phenyl group, preferentially substituted in the 2- and 6-positions with alkyl groups, such as methyl, ethyl or isopropyl.

In some embodiments, a device of the disclosure may include a copper-based material having near unity photoluminescent efficiency, with radiative lifetime in the range of 500 ns to 5 µs, or 1 µs to 3 µs. Additional information about some suitable copper-based materials may be found in Hamze, R., et al., Eliminating nonradiative decay in Cu(I) emitters: >99% quantum efficiency and microsecond lifetime. *Science* 2019, 363 (6427), 601-606 and Shi, S., et al., Highly Efficient Photo- and Electroluminescence from Two-Coordinate Cu(I) Complexes Featuring Nonconventional N-Heterocyclic Carbenes. *J. Am. Chem. Soc.* 2019, 141 (8), 3576-3588, both of which are incorporated herein by reference.

In some embodiments, a metalorganic TADF molecule may have a (carbene)Metal(amide) (also referred to herein as "cMa"). Such materials may provide high color purity and luminance efficiency with short radiative lifetimes, for example less than 700 ns, less than 600 ns, less than 500 ns, less than 400 ns, less than 300 ns, less than 200 ns, or less than 100 ns. Although certain embodiments of the present disclosure refer to blue emitters or blue TADF emitters, the disclosed metalorganic cMa TADF molecules may further be applied as green, yellow, red, infrared, or ultraviolet emitters having a high luminance efficiency, and having a peak emission wavelength anywhere in the visible, infrared, or ultraviolet spectrum.

In some embodiments, a triplet-controlled TADF emitter used with a device of the present disclosure has strong spin orbit coupling (SOC). SOC may be increased through use of a metal ion as contemplated herein, or may be increased by other methods. In some embodiments, an emitter with strong SOC further has rapid inter-system crossing (ISC). In such embodiments, $\tau_{TADF}$ is limited only by $\tau_{S_1} K_{eq}^{-1}$. Three- or four-coordinate Cu-based TADF complexes give a small value of $\Delta E_{ST}$, but severely limit the donor-acceptor coupling and thus give high $T_{S_1}$ and $\tau_{TADF}$>1 µs. In some embodiments, an emissive compound used herein has a metal ion not part of the excited state, but coupling the donor and acceptor moieties, leading to high TDMs for $S_1 \rightarrow S_0$ ($\tau_{S_1}$<100 ns) and a high ISC rate ($\tau_{ISC}$<200 ps). At the same time, the metal ion in some embodiments keeps the donor and acceptor sufficiently far apart to give a small $\Delta E_{ST}$ (and thus high $K_{eq}$).

Figure 6:
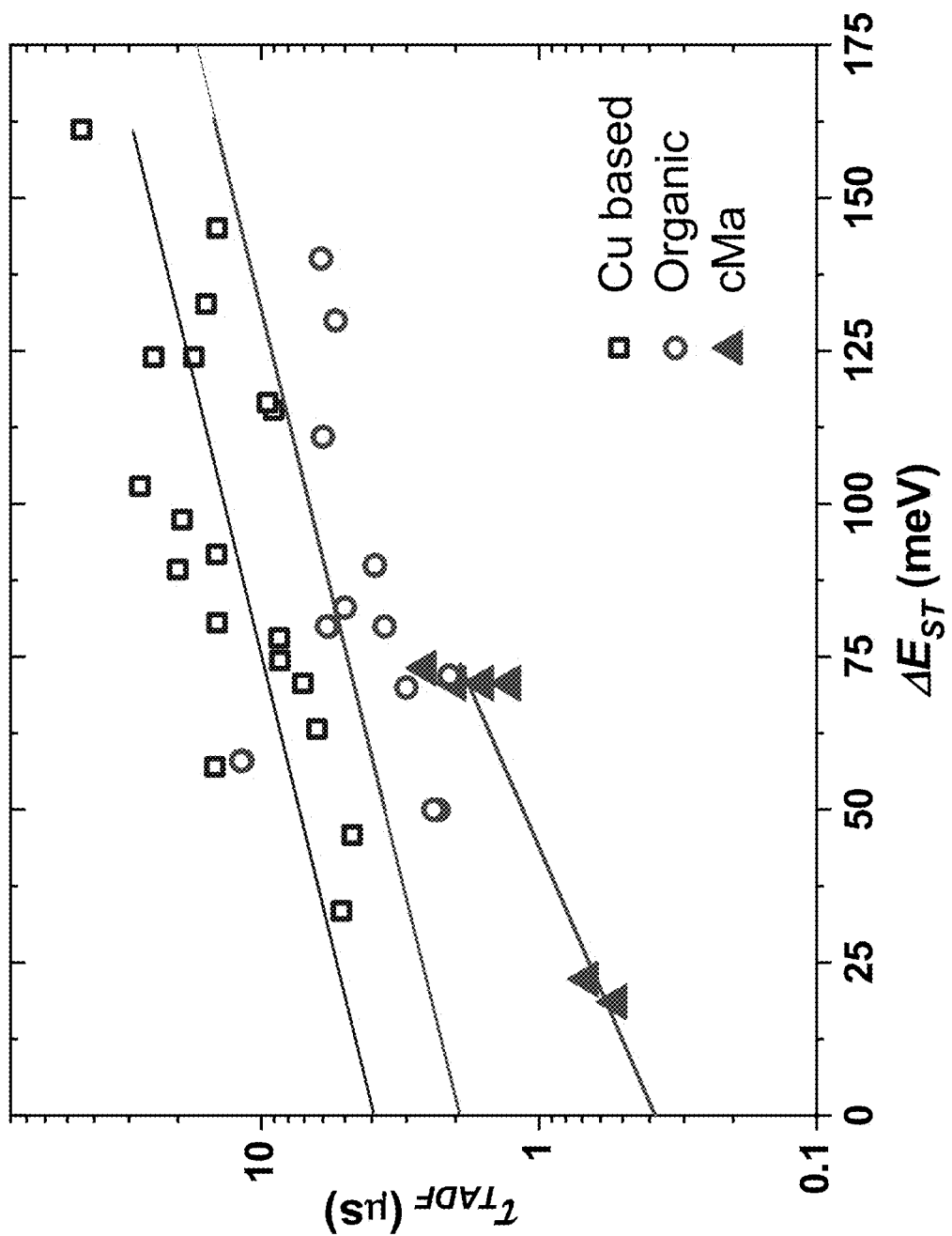
FIG. 6 shows a plot of experimentally determined $\tau_{TADF}$ and $\Delta E_{ST}$ for both organic (red) and inorganic (blue) based TADF emitters. The data shown in green are cMa emitters.

TADF emitters have been investigated extensively. See e.g. Y. Liu, et al., "All-organic thermally activated delayed fluorescence materials for organic light-emitting diodes," *Nature Reviews Materials*, vol. 3, no. 4, 2018; H. Uoyama, et al., "Highly efficient organic light-emitting diodes from delayed fluorescence," *Nature*, vol. 492, no. 7428, pp. 234-8, Dec. 13, 2012; and R. Czerwieniec, "Cu(I) complexes—Thermally activated delayed fluorescence. Photophysical approach and material design," *Coordination Chemistry Reviews*, vol. 325, pp. 2-28, 2016; all of which are incorporated herein by reference in their entireties. A compilation of measured TADF lifetimes, $\tau_{TADF}$, versus $\Delta E_{ST}$ for both organic TADF emitters and a number of Cu-based TADF materials is shown in FIG. 6. Both organic and 3- or 4-coordinate Cu-based TADF materials analogous to those used in FIG. 6. The $\tau_{TADF}$ for organic materials shown are an underestimate because the photoluminescence efficiency ($\Phi_{PL}$) used to calculate $\tau_{TADF}$ are based on a combination of prompt and delayed emission. Extrapolating to $\Delta E_{ST}$=0, gives $\tau_{TADF}$ values >2 µs. The cMa compounds disclosed herein (filled triangles, FIG. 6), represent a promising direction to achieve radiative lifetimes <<1 µs with high $\Phi_{PL}$. The use of Janus carbenes and macrocyclic structures in some embodiments leads to lower lifetimes than those predicted by the simple extrapolation.

Figure 8:
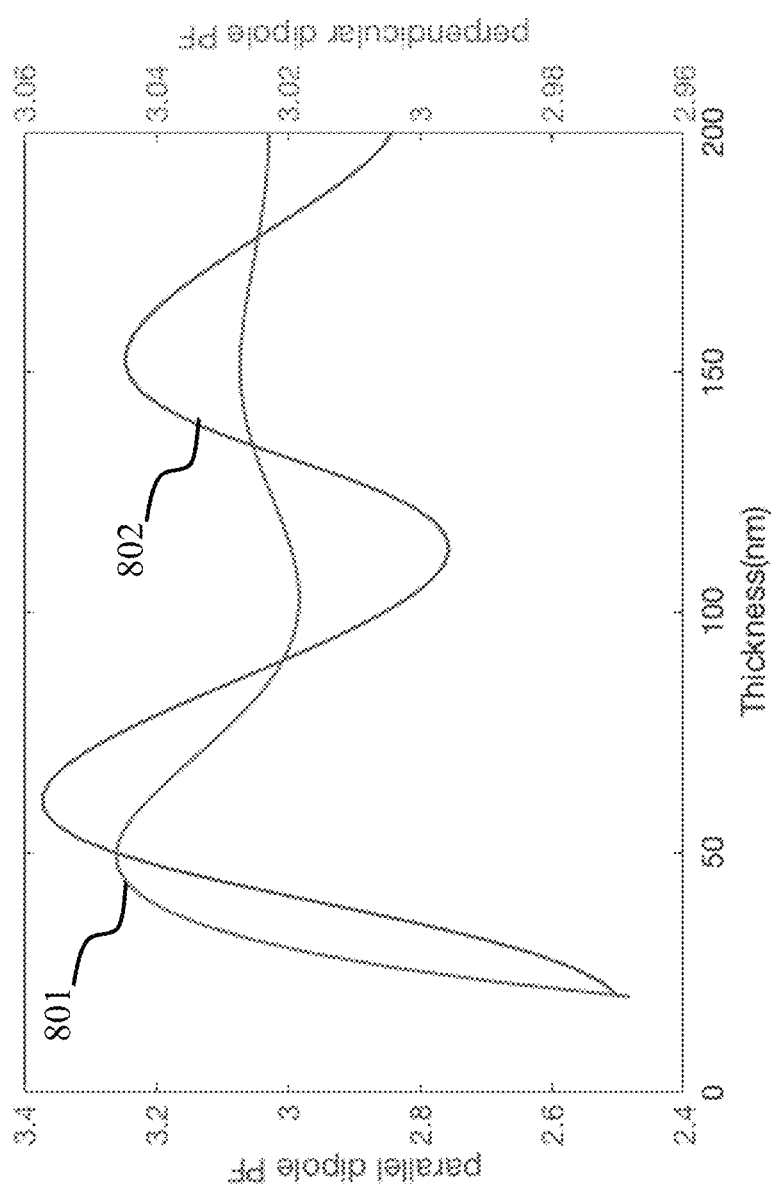
FIG. 8 shows a graph of calculated Purcell factors vs. $TiO_2$ thickness for molecular TDMS oriented parallel or perpendicular to the substrate plane. The structure is the same as used in FIG. 5.

In some embodiments, a compound used in a device of the disclosure is a two-coordinate, carbene-metal-amide complex of Cu, Ag and/or Au. In such compounds, the carbene-acceptor and amide-donor are on opposite sides of the metal ion, separated by roughly 4 Å. One exemplary compound 801 is shown in FIG. 8, with the emission energy tuned by the choice of carbene and amide group. By using different carbenes/amides, the emission wavelength may be tuned from violet to red. In some embodiments, a cMa compound may be isostructural, isoelectronic, or both. Compounds may be deposited via vacuum sublimation, or any other suitable method. The HOMO or LUMO of the emitter may in some embodiments be selected to match a given host or transport material. For example, if a cMa compound is in an electron transporting host, it is important for the cMa to have a HOMO level 200-300 mV or more above that of the host material. This energy alignment ensures that holes will be trapped and transported on the cMa material and recombination of the hole and electron will take place on the cMa dopant.

When the cMa materials disclosed herein are used in combination with design elements and methods disclosed above to manipulate PF, the radiative lifetime of an emissive compound may be decreased (and the usable lifetime of the device correspondingly increased) by a further factor of 5.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Objectives

The objective of the disclosed experiments is to reduce TTA and TPA-induced device degradation by increasing the radiative recombination rate of the emitting molecules via tailoring the OLED optical cavity and structures of metalorganic TADF emitters, which in turn will reduce the exciton density in the OLED emission zone. By reducing exciton density, the probability for excitons to encounter a polaron or another exciton and thereby undergo a high energy-induced degradation event is considerably reduced. Hence, decreasing the radiative emission lifetime should result in increasing the device operational lifetime. The objective is therefore to increase the stability as well as the OLED efficiency, leading to 100% internal efficiency WOLEDs whose lifetimes achieve $T_{70}$=50,000 h at an initial luminance of $L_0$=3000 cd/m$^2$.

Technical Scope Summary

To substantially reduce emitting lifetimes below the current >2 μs for even the most efficient phosphors, the following experiments combine two strategies. Task 1 seeks to increase the emission rate by at least a factor of 5 from the natural rate through the Purcell effect by providing access to additional optical modes. Task 2 focuses on increasing the emission rate through modification of TADF molecules via the use of metal (Ag, Au and Cu) linkers between the intramolecular donor and acceptor groups. These metalorganic TADF molecule lifetimes are as short as 100 μs. Once developed, the lifetime of the TADF molecules will be further reduced by the Purcell effect. In a first phase, an OLED structure that reaches a PF=3 along with demonstrating a statistically significant (i.e. >1.5×) increase in blue emitting device stability based on this increased PF is demonstrated, and in a second phase, blue emitting TADF molecules with radiative lifetimes of no greater than 300 ns are demonstrated. The final goal of the disclosed experiments is to demonstrate WOLEDs with lifetimes exceeding $T_{70}$=50,000 h with an initial luminance of 3000 cd/m$^2$ using a combination of an optical cavity along with a graded and triplet-managed EML.

Reducing Radiative Lifetimes of Blue PHOLEDs

First, the efficacy of using the Purcell effect to reduce the radiative lifetime of phosphorescent and perhaps metalorganic TADF emitters was demonstrated, and the correlation between radiative lifetime and WOLED stability was calculated. The Purcell effect is the ability to modify the radiative lifetime of an emitting species (e.g., a phosphor) by decreasing or increasing the number of optical modes available to that emission. This is simply understood using Fermi's golden rule, whereby the total radiative rate, $k_r$, is given by Equation 2 below.

$$k_r = \frac{2\pi}{\hbar} \int |\langle i|\mu \cdot F|f\rangle|^2 \rho_{ph}(E) dE \qquad \text{Equation 2}$$

In Equation 2, h is Planck's constant divided by 2π, i and f are the initial and final molecular states (corresponding to the excited and ground states), respectively, μ is the molecular transition dipole moment (TDM), F is the electric field, E is the energy and $\rho_{ph}(E)$ is the photon density of states. This simple expression provides the essential information needed to determine how to increase the total radiative rate $k_r$, thereby reducing the probability for exciton annihilation that provides the fundamental limitation to the stability of blue phosphors. That is, increasing the optical electric field amplitude, the photon density of states into which the molecule can radiate, or the molecule's own TDM all increase $k_r$. Since the TDM of most phosphors cannot be significantly modified without reducing the radiative efficiency, the field intensity and the mode density remain to be modified by varying the OLED cavity, which can significantly alter both F and $\rho_{ph}$.

The mode density and electric field were modified by changing the dimensions of the optical cavity of the OLED, as well as by the orientation of the TDM relative to the substrate and/or contacts. This is illustrated in device 500 in FIG. 5 for an exemplary blue emitting PHOLED (at λ=450 nm) with two metal contacts, cathode 501 and anode 505. The emitting side is adjacent to the surface of a multilayer dielectric reflector 511, which in the exemplary diagram comprises alternating layers of $TiO_2$ and $MgF_2$ (506-509). The metal cavity encourages coupling to surface plasmon polariton (SPP) modes, thereby greatly increasing $\rho_{ph}$ compared to conventional OLEDs. The dielectric stack supports transverse electric waveguide modes that are extracted into the emitting direction 512. In one exemplary embodiment of FIG. 5, the layers have the following thicknesses: electron transport layer 502 has a thickness of 45 nm, hole transport layer 504 has a thickness of 40 nm, silver anode 505 has a thickness of 15 nm, metal layer 506 has a thickness that may be varied, with the effects shown in the graph of FIG. 7, metal layer 507 has a thickness of 80 nm, metal layer 508 has a thickness of 49 nm, and metal layer 509 has a thickness of 80 nm. In one embodiment, the thicknesses of the layers are selected to maximize the electric field in the one or more emissive layers, and to maximize $\rho_{ph}$.

Figure 7:
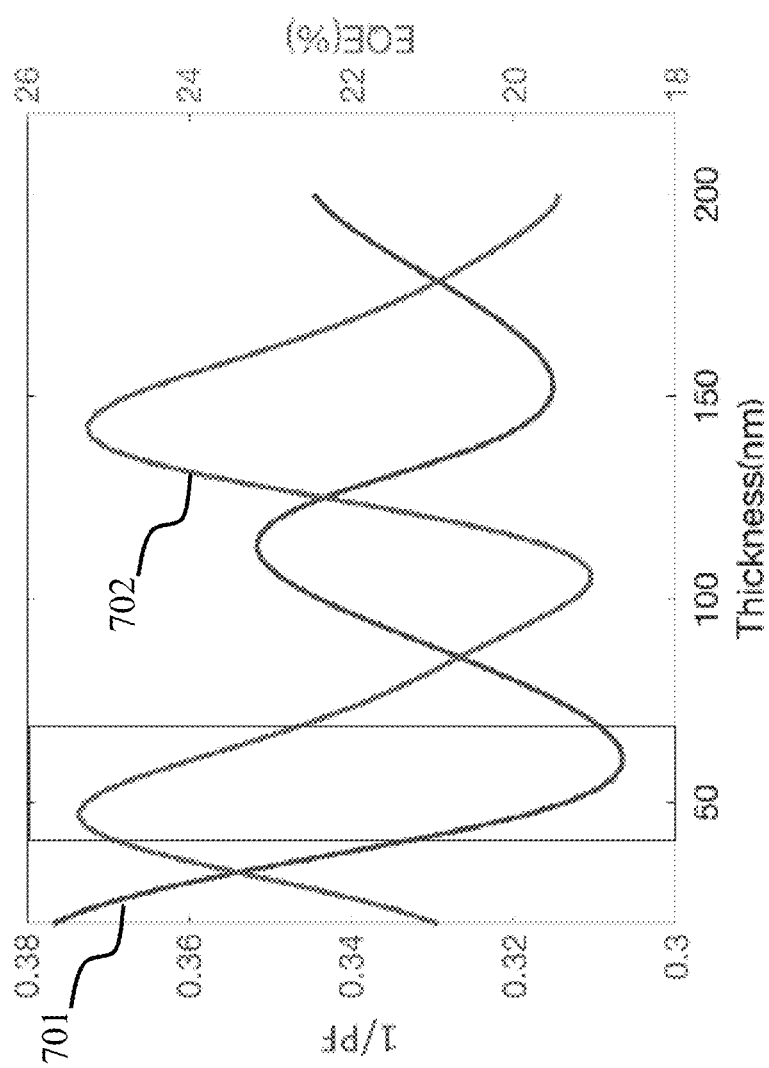
FIG. 7 shows a graph of inverse Purcell factor and device EQE vs. $TiO_2$ layer thickness (x) for a blue-emitting (at 450 nm) PHOLED structure of FIG. 5.

The corresponding plot in FIG. 7 shows 1/PF (701) and the PHOLED external quantum efficiency (702), EQE, vs. thickness in nm of the first $TiO_2$ layer 506 in the dielectric stack (along the x-axis). The optimal combination of PF=3.2 and EQE=25.5% is at x~60 nm. As shown in the graph, increasing PF had the added effect of increasing EQE. The larger PF increased device stability via a decreased probability for exciton annihilation events, while the increased EQE reduced the current required to achieve a given brightness, thus also increasing stability. The data thus shows circumvention of a common tradeoff, where device lifetime is increased at the expense of device stability. With proper cavity design, both lifetime and stability can be increased simultaneously.

The probability of an encounter between an exciton and a polaron that leads to a molecular dissociation is given in Equation 3 below:

$$P_{TPA} = \frac{3K_X}{k_r 4\pi r^3} = \frac{3K_X}{k_{r0} 4\pi r^3 PF} \quad \text{Equation 3}$$

In Equation 3, $K_X$ is the rate of defect formation (~$10^{-23}$ $cm^3$/s for many blue phosphors), and r is the exciton encounter radius (approximately equal to the molecular diameter). Thus, PF=3 results in a reduction in molecular dissociation rate, and an increase in PHOLED lifetime by approximately the same amount. While Equation 3 is valid for TPA, if molecular degradation occurs primarily via TTA then the probability follows Equation 4 below for triplet-triplet annihilation.

$$P_{TTA} = \frac{1}{k_r^2} = \frac{1}{(k_{r0} PF)^2} \quad \text{Equation 4}$$

As shown in Equation 4, if TTA is the dominant annihilation mechanism, then a PF of 3 will result in a 9-fold enhancement of lifetime. The dominance of TPA or TTA for a given materials system is determined by analysis of the transient response of the OLED, as discussed in Baldo, et al., Transient Analysis of Organic Electrophosphorescence. II. Transient Analysis of Triplet-Triplet Annihilation *Phys. Rev. B* 2000, 62, 10967, incorporated herein by reference.

Another method for modifying PF as discussed above involves manipulation of the molecular dipole alignment of one or more layers. As shown in the graph of FIG. 8, PF may vary along the thickness (x axis) of the metal layer 506 based on whether the transition dipole moments are aligned perpendicular (plot 801) or parallel (plot 802) to the substrate plane. As shown in FIG. 8, parallel dipole alignment resulted in a larger PF than for perpendicular dipoles, although the enhancement was minor. Nevertheless, parallel dipole alignment resulted in a considerably improved outcoupling, thereby conferring the benefits of reducing current while simultaneously increasing PF.

Metal-Based TADF Molecules

Figure 9:
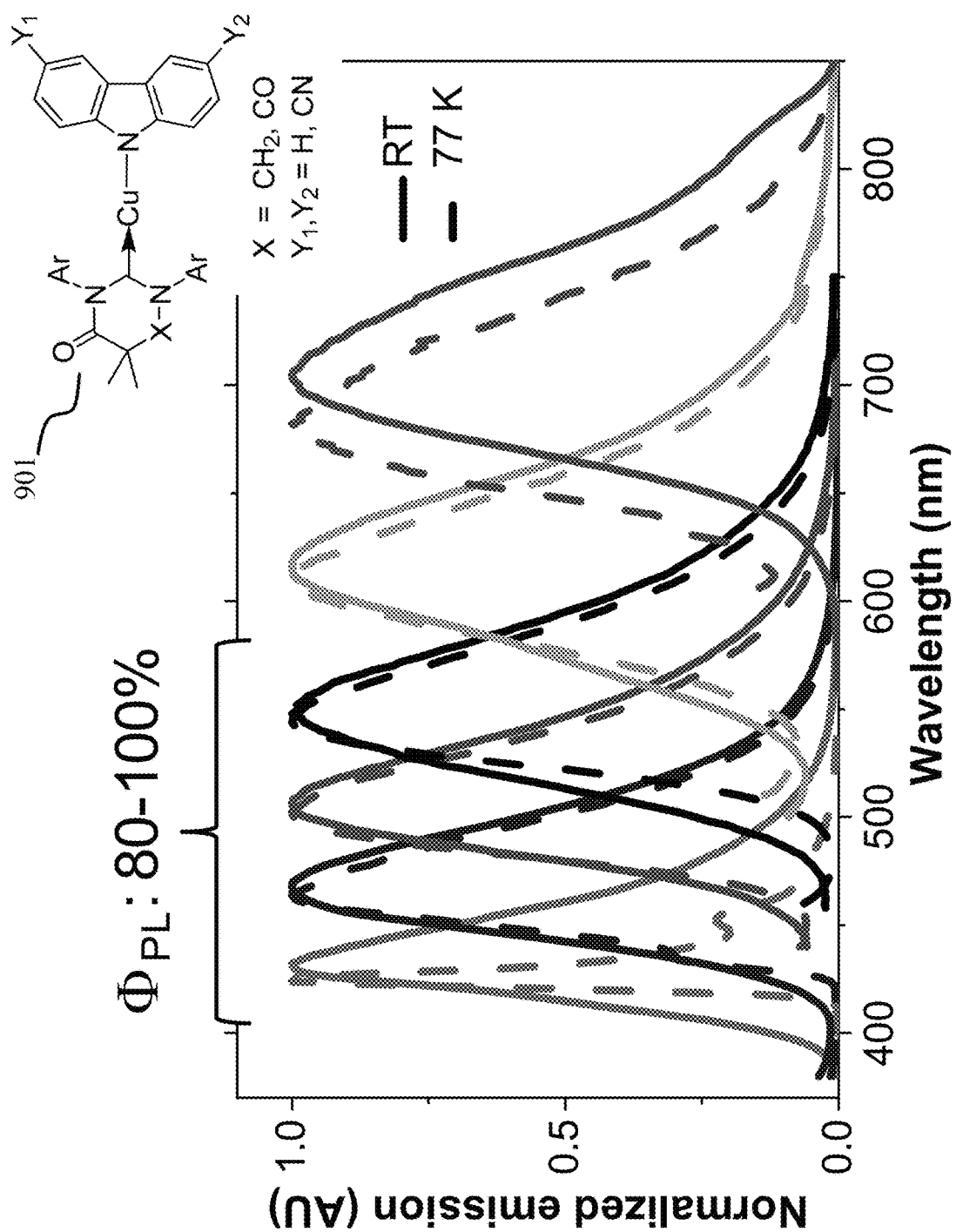
FIG. 9 shows Emission spectra of six different Cu-based TADF emitters with a photoluminescent yield of $\Phi_{PL} \to 1$ with radiative lifetimes of 1.0-1.5 µs.

An exemplary family of metal-based TADF molecules 901 is shown in FIG. 9. As shown in the graph of FIG. 9, the depicted copper-based TADF emitter has near unity photoluminescent efficiency. Materials in the depicted family have been used to prepare blue and green emissive OLEDs with high efficiencies (ca. EQE=20%). Ag- and Au-based analogs of these materials give high luminance efficiencies with radiative lifetimes as short as 0.5 μs. (see Hamze, R, et al., "Quick-Silver" from a systematic study of highly luminescent, 2-coordinate, $d^{10}$ coinage metal complexes. *Journal of the American Chemical Society* 2019, 141, 8616-8626, incorporated herein by reference.) In such a (carbene)Metal (amide) (cMa) system, we have achieved high color purity and luminance efficiency, with radiative lifetimes markedly shorter than any other TADF material and shorter than the most efficient heavy metal-based phosphors. According to TPA/TTA theory, short radiative lifetimes markedly enhance the operational lifetime of OLEDs. In this program we will, therefore, explore methods to achieve even shorter radiative lifetimes for blue, green, yellow and red TADF emitters while maintaining a high luminance efficiency. We should be able to push the radiative lifetime of cMa and related compounds to 100 ns or less.

Figure 10A:
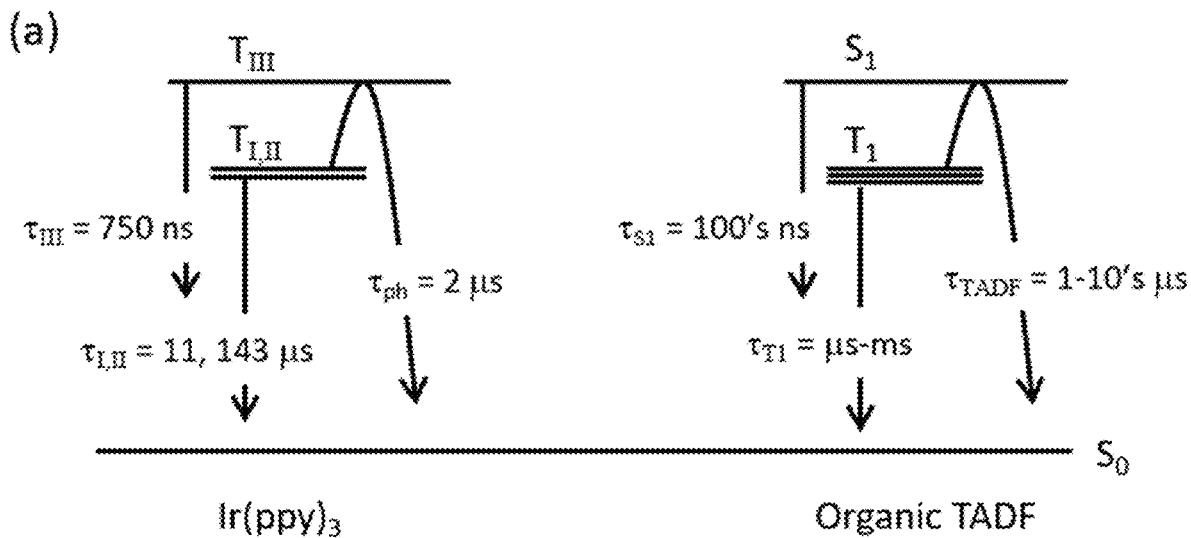
FIG. 10A shows emission processes for heavy metal (Ir(ppy)$_3$) and organic TADF phosphors.
Figure 10B:
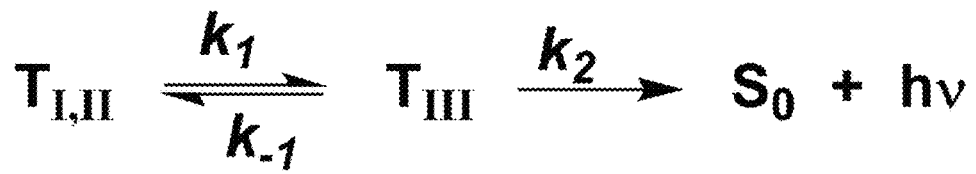
FIG. 10B shows kinetic scheme and rate.

With reference to FIG. 10A, the emission processes for heavy metal phosphors (1001) and TADF phosphors (1002) are closely related. In both cases, emission involves thermal promotion to a higher lying state, followed by emission from that state with corresponding time constants of $\tau_{ph}$ and $\tau_{TADF}$. In phosphors, the energy spacing between the spin sublevels is the zero field splitting (ZFS), and in TADF the energy difference between the lowest singlet ($S_1$) and triplet ($T_1$) states ($\Delta E_{ST}$) controls the emission rate. The rate of interconversion of the triplet sublevels is markedly higher than emission from $T_{III}$ (i.e. $k_1$, $k_{-1} \gg k_2$) so this kinetic scheme is modeled by a rapid pre-equilibrium in FIG. 10B. A ZFS of 10 meV for Ir(ppy)$_3$ at room temperature gives an equilibrium constant of $K_{eq}$=0.3, thus the predicted $\tau_{ph}$ is very close the measured value of 2 μs. Note that the higher spin multiplicities of the lower states give a limiting value of $K_{eq}$=½ for phosphors and ⅓ for TADF emitters.

Existing work in TADF emitters has heretofore focused on metal-free donor-acceptor compounds, see for example Uoyama, H., et al., Highly efficient organic light-emitting diodes from delayed fluorescence. *Nature* 2012, 492 (7428), 234-8, incorporated herein by reference. The principal design rule has been to decrease $\Delta E_{ST}$ (increasing $K_{eq}$) using a large separation and/or orthogonal arrangement of the intramolecular donor and acceptor groups comprising the molecule. However, without a metal ion to provide spin-orbit coupling (SOC), the intersystem crossing (ISC) rate is very small, even with a small $\Delta E_{ST}$. Since $\tau_{ISC}$ is comparable to $\tau_{S_1}$, $\tau_{TADF}$ will be larger than $\tau_{S_1}K_{eq}^{-1}$. Moreover, weak donor-acceptor coupling leads to long $\tau_{S_1}$, so the shortest $\tau_{TADF}$ for all-organic TADF compounds is 1-5 μs. See also Liu, Y., et al., All-organic thermally activated delayed fluorescence materials for organic light-emitting diodes. *Nature Reviews Materials* 2018, 3 (4), incorporated herein by reference.

Cu, Ag and Au give cMa compounds that are isostructural and isoelectronic. Table 1 below shows the thermodynamic and kinetic parameters for (CAAC)MCz and (MAC)MCz compounds, doped at 1% in polystyrene. The listed ISC lifetime ($\tau_{ISC}$) is in tetrahydrofuran (THF) solution. (Cz=N-carbazololyl, see FIG. 11 for CAAC and MAC structures). Table 2 shows the calculated frontier orbital energies for carbene-Cu-donor. The HOMO-LUMO energy gap may be used as an estimate of the excited state energy. As shown in the tables, all of the compounds show picosecond ISC, so $\tau_{TADF}$ is limited only by $\tau_{S_1}K_{eq}^{-1}$. The complexes give high luminance efficiency and short $\tau_{TADF}$, with the Ag-based emitters giving the smallest $\Delta E_{ST}$ and $\tau_{TADF} \leq 500$ ns. Coplanarity of the carbene and amide ligands allows the central metal ion to interact with both the hole and electron wavefunctions of the excited state, albeit weakly, enhancing the oscillator strength of the $S_1 \rightarrow S_0$ transition. The (MAC) AuCz emitter gives OLED EQE=18%. The HOMO, LUMO, $S_1$ and $T_1$ energies for a given family of cMa complexes are unaffected by the choice of metal ion, but emission lifetimes typically fall in the order Ag<Au<Cu, with a Ag:Cu $\tau_{TADF}$ ratio of 1:5.

TABLE 1

| Cpd | $\lambda_{max}$ (nm) | $\tau_{mea}$ (μs) | $\Phi_{PL}$ | $\tau_{ISC}$ (ps) | $\Delta E_{ST}$ (meV) | $\tau_{S_1}$ (ns) | $K_{eq}$ |
|---|---|---|---|---|---|---|---|
| Cu$^{CAAC}$ | 470 | 2.8 | 1.0 | 48 | 74 | 72 | 0.02 |
| Ag$^{CAAC}$ | 472 | 0.50 | 1.0 | 140 | 19 | 83 | 0.16 |
| Au$^{CAAC}$ | 472 | 1.14 | 1.0 | <25 | 71 | 25 | 0.02 |
| Cu$^{MAC}$ | 506 | 1.4 | 0.9 | 200 | 71 | 28 | 0.02 |
| Ag$^{MAC}$ | 512 | 0.33 | 0.79 | 160 | 23 | 46 | 0.14 |
| Au$^{MAC}$ | 512 | 0.83 | 0.85 | 30 | 71 | 24 | 0.02 |

TABLE 2

| carb. | donor | LUMO (eV) | HOMO (eV) | LU-HO (eV) |
|---|---|---|---|---|
| 1 | Cz | −1.034 | −3.864 | 2.85 |
| 3 | Cz | −1.497 | −4.218 | 2.72 |
| 5 | Cz | −1.606 | −4.218 | 2.61 |
| CAAC | Cz | −1.687 | −4.218 | 2.53 |
| 4 | Cz | −1.714 | −4.272 | 2.56 |
| 5 | 6 | −1.687 | −4.762 | 3.08 |
| MAC | 6 | −2.313 | −4.898 | 2.59 |
| 2 | NPh$_2$ | −0.653 | −3.810 | 3.16 |
| 1 | NPh$_2$ | −0.898 | −3.483 | 2.59 |
| 3 | NPh$_2$ | −1.279 | −3.919 | 2.64 |

Figure 11:
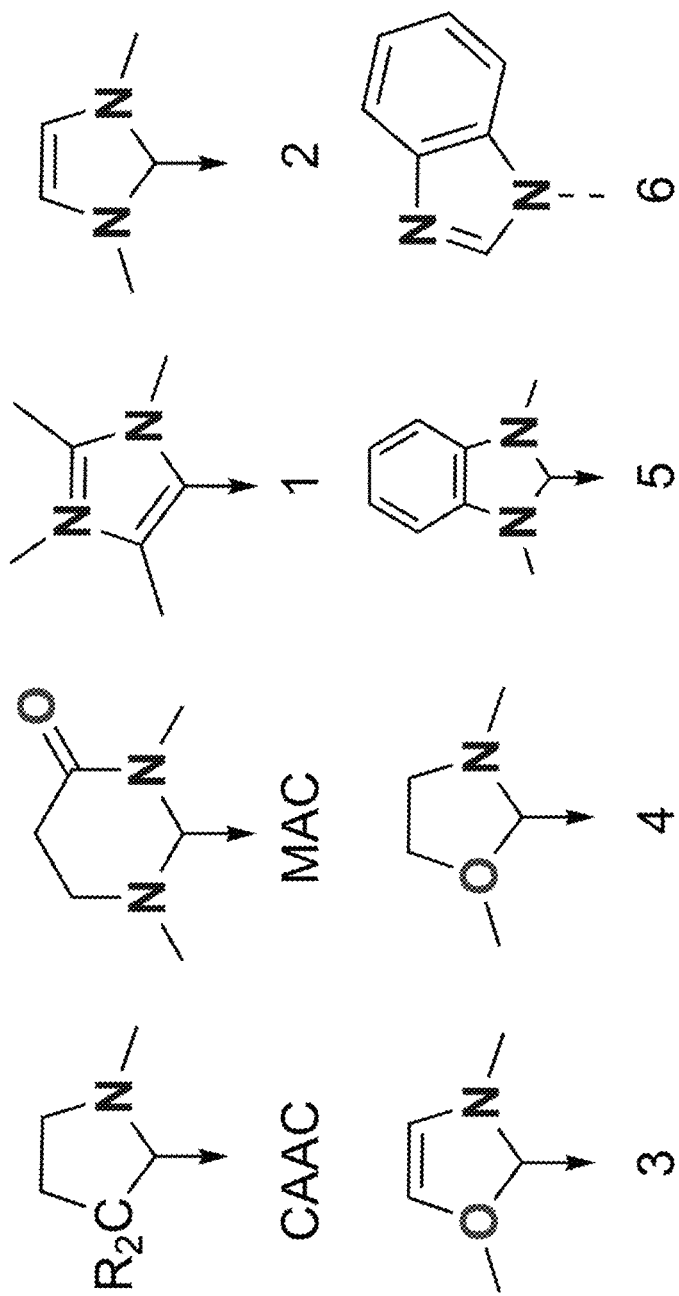
FIG. 11 shows chemical structures referenced in Table 2.

The numbers in the carb and donor columns of Table 2 denote the corresponding chemical structures shown in FIG. 11. Donor 6 in Table 2 above is

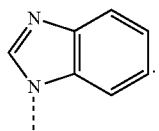

While the Purcell effect will not affect $K_{eq}$, it will modify $\tau_{S_1}$. Because $\tau_{TADF} = \tau_{S_1}K_{eq}^{-1}$ for cMa compounds, the decrease in $\tau_{S_1}$ brought about by the Purcell effect has the potential to lower radiative lifetime by a further factor of 5.

The emission color in this family of materials is easily tuned by the choice of carbene-acceptor and amide-donor. A series of carbenes and amides are given in Table 2 along with the LUMO and HOMO energies for the (carbene)Cu(N-carbazolyl) complex. Modeling showed that all the complexes in Table 2 emit from an amide-to-carbene CT state. In the cMa system the HOMO or LUMO of the emitter may be selected to match a given host or transport material. Therefore, the best emitter for a given set of OLED materials may be quickly identified and prepared.

A set of cMa compounds was used to directly probe the relation between $\tau_{TADF}$ and the OLED lifetime, since changing the metal between Cu, Ag and Au only changes $\tau_{TADF}$, leaving all other parameters unaffected. Unfortunately, the (carbene)Ag(amide) compounds decompose during sublimation—an instability that is due to a combination of weaker inherent bonding (consistent with the small value of $\Delta E_{ST}$) and the monodentate nature of the ligands. To improve stability, macrocyclic ligands were used, as shown in FIG. 12A and FIG. 12B. The length of the bridging groups was varied to find the optimal length to hold the carbene and amide ligands coplanar and maintain a C-M-N bond angle close to 180°, both parameters that lead to high efficiency and short luminance lifetime. Finding the optimal bridge length was carried out computationally before the bridged complexes were prepared.

In the examined cMa compounds, the ~4 Å distance between the carbene and amide were used to minimize $\Delta E_{ST}$. If the ligands are twisted away from coplanarity, $\Delta E_{ST}$ is further decreased, but this may lead to an increase in $\tau_{S_1}$. At a dihedral angle of 45°, a marked drop in $\Delta E_{ST}$ is expected while the metal ion may sufficiently bridge the donor and acceptor to maintain a fast $\tau_{S_1}$ to give a fast $\tau_{TADF}$. The linker forces such a twist between the two ligands. FIG. 12B shows the impact of a $C_4$ vs. $C_5$ bridge on the dihedral angle (dha). Structures were computationally surveyed to determine the dependence of $\Delta E_{ST}$ and $\tau_{S_1}$ to find the optimal dha that minimizes $\tau_{TADF}$.

Figure 13:
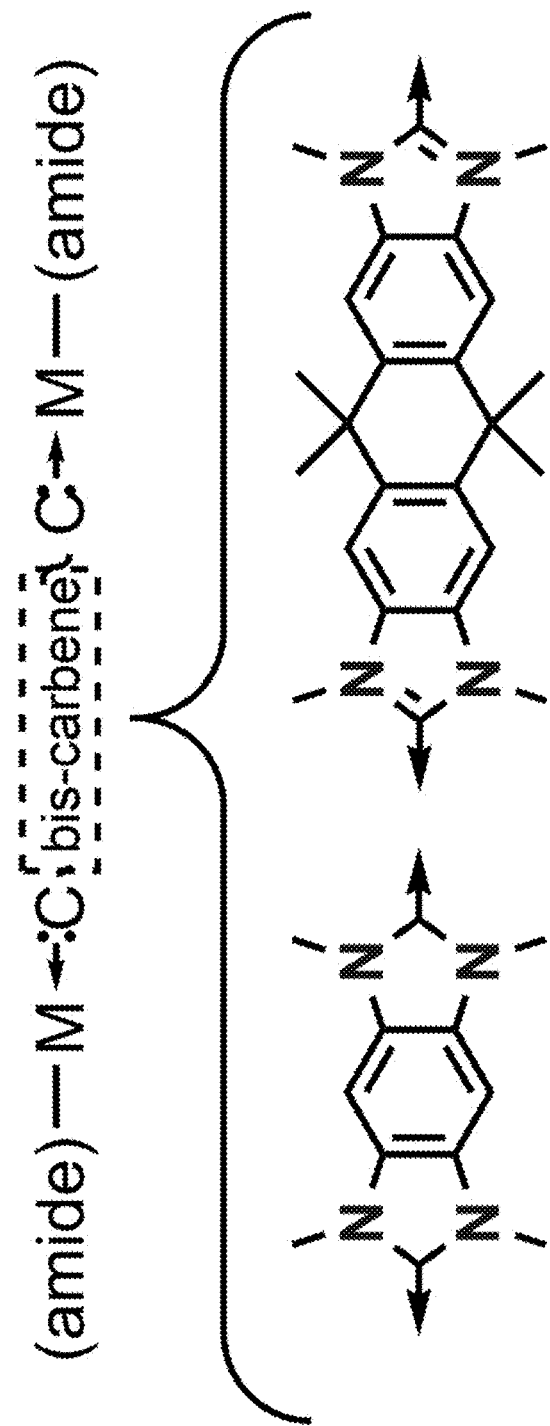
FIG. 13 shows Janus carbene phosphors with LUMO energies similar to CAAC and MAC.

An approach to further increase radiative rates is to use bimetallic derivatives with two-coordinated "Janus" bis-carbenes shown in FIG. 13. This arrangement of donor-acceptor moieties leads to strong intramolecular dipole-dipole coupling. This splits the transition into energetically higher (forbidden) and lower (allowed) transitions, where the latter have twice the oscillator strength of the mononuclear complex. A similar splitting for the triplet states leads to an overall decrease in $\Delta E_{ST}$. This strategy was shown to increase radiative decay rates for binuclear four-coordinated Cu complexes nearly six-fold relative to their mononuclear counterparts (see Schinabeck, A., et al., Symmetry-Based Design Strategy for Unprecedentedly Fast Decaying Thermally Activated Delayed Fluorescence (TADF). Application to Dinuclear Cu(I) Compounds. *Chem. Mater.* 2019). The combined effects of a faster singlet and smaller $\Delta E_{ST}$ substantially decreases radiative lifetimes for the corresponding Cu, Ag and Au complexes. A six-fold increase in the radiative decay rate for (CAAC)M(Cz) would give 100-200 ns emission lifetimes for Ag- and Au-based emitters. Tailoring donors and macrocycles to control thermal stability and structure can complement the Janus-type carbenes.

Test structures were fabricated with appropriately designed optical cavities and layering schemes to relate the long term operational stability to the radiative lifetimes, PF and EQE thus obtained. Reliability test protocols and packaging schemes were used to determine the lifetime to $T_{70}$ for statistically significant populations of devices as a function of initial luminance, $L_0$ that served as the accelerated aging parameter.

Methods

Devices were fabricated using archetype metalorganic phosphors in the emission layer (EML), and the cavity lifetime was measured and compared with the natural lifetime to determine PF using optical pumping and transient photoluminescence. The calculated PF values were compared to theoretical predictions in calculated earlier. A goal of the process was to demonstrate an EML whose PL lifetime is decreased by >2× from the natural phosphor lifetime when placed in an optical microcavity designed according to the procedures disclosed herein.

Devices with Radiative Rates of Metalorganic Phosphors and TADF Molecules Increased by PF OLEDS were fabricated with phosphors in the EML. Transient EL measurements were used to determine PF. Structures were sought within the fabricated devices having PF 5 and EQE>20% (corresponding to IQE=100%). Angle dependence of emission was then determined as a second check of the PF measurement. The fabrication task was then repeated using a long lived blue emitting phosphor, Ir(dmp)$_3$ in CBP with PF=3-5. The fabrication task was also repeated with the most promising, short lifetime metalorganic TADF molecules developed in the procedures disclosed below.

From these data, we determined whether placement in a microcavity can increase the emission rate of short-lived, near-equilibrium Ag-, Au- or Cu-linked TADF molecules by at least a factor of 1.5.

Device Operational Lifetimes Extended by PF

As a further task, device operational lifetimes extended by PF were demonstrated, indicating a link between shortened radiative lifetime and increased blue OLED stability.

A statistically significant population (~10 each) of blue emitting Ir(dmp)$_3$ in CBP PHOLEDs were placed on lifetest with PF=1 and PF=3-5. The devices were packaged in a standard test coupon using a peripheral epoxy seal between the glass substrate and glass lid combined with a desiccant. The $T_{70}$ of the devices was measured as a function of PF with initial luminance of $L_0$=1000-10,000 cd/m$^2$. The functional dependence of $T_{70}$ on PF was then calculated to determine if triplet-polaron or triplet-triplet annihilation were the dominant decay mechanisms. The goal of this task was to demonstrate a statistically significant increase in device stability to $T_{70}$, along with a proportional relationship between radiative rate and $T_{70}$ according to Equation 3 above. An additional goal was to demonstrate an OLED structure that reaches a PF=3 along with demonstrating an increase in blue emitting device stability based on this increased PF.

The task was then repeated using metalorganic TADF molecules developed using the methods disclosed above. A goal of this task was to determine if increasing the PF results in an increase in device stability, as a test of the rapid equilibration of the singlet and triplet states in metalorganic TADF molecules can result in increased radiative transition rates. In further variation, blue TADF molecules were used.

High Stability Blue Emitting OLEDs with Shortened Radiative Lifetimes

Using the most promising cavity and lifetime results obtained from the methods above, the materials were combined in a graded and managed EML in a blue emitting PHOLED structure. A statistically significant population (~10 each) of blue emitting Ir(dmp)$_3$ was placed in CBP PHOLEDs on lifetest with PF=3-5. The devices were packaged in a standard test coupon using a peripheral epoxy seal between the glass substrate and glass lid combined with a desiccant. $T_{70}$ of the devices was measured as a function of PF with initial luminance of $L_0$=1000-10,000 cd/m$^2$. Devices were then tested to achieve an operational lifetime of $T_{70}$>10,000 hr at $L_0$=1000 cd/m$^2$, which when used in a WOLED at $L_0$=3000 cd/m$^2$ translates to $T_{70}$>50,000 h.

A goal of this process was to test a statistically significant population of packaged blue emitting PHOLEDs and/or metalorganic TADF molecules, and in so doing to demonstrate an operational lifetime of $T_{70}$>10,000 h at $L_0$=1000 cd/m$^2$ for devices with triplet-managed and graded EMLs in microcavities with PF=3-5.

A further task was to use the blue emitting, high PF EMLs developed using the methods disclosed above along with stacked red and green emitting sections to demonstrate WOLED lifetimes at $L_0$=3000 cd/m$^2$ of $T_{70}$>50,000 hr using either Ir- or short radiative lifetime TADF molecules in stacked, managed and graded EML devices.

Short Emission Lifetime, High Stability Metal-Based TADF Molecules

A goal of this task was to prepare stable blue (carbene)M(amide) (cMa) emitters with $\Phi_{PL} \geq 0.8$ and $\tau_{TADF}$<200 ns. A wide range of carbene and amide moieties were investigated in cMa structures and their properties used to develop computational models to accurately predict $\tau_{TADF}$ and $\lambda_{max}$.

As a first task, 20-30 cMa compounds for M=Cu, Ag, Au were prepared with a range of carbene and amide groups. The various properties (structure and $\epsilon_{abs}$, $\Phi_{PL}$, $\tau_{TADF}$, $\Delta E_{ST}$, $\tau_{S_1}$) were characterized. An interim goal was to identify a minimum of four cMa compounds giving blue emission and having a $\Phi_{PL} \geq 0.8$.

As a second task, a database of experimental structural, photophysical and kinetic data was built from the compounds studied in the task above for use in refining the computational models. An interim goal was to build the database with at least 10 blue emissive cMa compounds and having a total size of at least 25 candidates.

From this database, a computational modeling scheme was developed to predict the energies and photophysical properties for cMa complexes, including HOMO/LUMO energies, emission energy, $\Delta E_{ST}$, $\tau_{S_1}$, $\tau_{TADF}$ and $\Phi_{PL}$. An interim goal was to accurately predict properties of cMa compounds such that the computational model could identify cMa compounds with $\tau_{TADF}$<500 ns.

Macrocyclic Ligands to Enhance Thermal Stability

The monodentate ligands of the cMa complexes identified in the task disclosed above were bridged to form a macrocyclic bidentate ligand to enhance thermal stability of the complexes and reduce nonradiative decay rates. First, blue emitting, macrocyclic, singly strapped (BzI)M(Cz) compounds were prepared and their photophysical properties were measured, including $\Phi_{PL}$, $\tau_{TADF}$, $\Delta E_{ST}$ and $\tau_{S_1}$. Singly strapped cMa compounds of the most promising candidates were then prepared, their structures and photophysical properties were measured. An interim goal was to prepare and characterize ≥5 singly strapped cMa compounds that gave blue emission, $\Phi_{PL}$>0.7 and $\tau_{TADF}$≤1 μs.

Next, doubly strapped cMa compounds of the most promising candidates were prepared, and their structures and photophysical properties were measured. An interim goal was to prepare and characterize doubly strapped cMa compounds that gave blue emission with $\Phi_{PL} \geq 0.8$ and $\tau_{TADF}$<1 μs using at least two different linkage chemistries. OLEDs were then prepared with high efficiency macrocyclic cMa compounds for isoelectronic M=Cu, Ag and Au and their operational lifetimes were tested. An interim goal was to prepare and test OLEDs with the macrocyclic cMa compounds for M=Cu, Ag and Au, demonstrating blue emission with an EQE>15%. Another interim goal was to demonstrate a blue emissive cMa with a $\tau_{TADF}$ 300 ns and IQE>75% (corresponding to EQE>15% without external outcoupling methods).

Tuning Structure to Minimize $\tau_{TADF}$

The dihedral angle (dha) between carbene and amide ligands was modified as a means to decrease $\Delta E_{ST}$ and $\tau_{TADF}$. The optimal angle was used to prepare blue emissive cMa compounds.

First, blue emitting (BzI)M(Cz) complexes were prepared (e.g. FIG. 12B) with the carbene and amide dha ranging from 0-65°, and their structures and photophysical properties were measured, including $\Phi_{PL}$, $\tau_{TADF}$, $\Delta E_{ST}$ and $\tau_{S_1}$ for M=Cu, Ag and Au. Next, blue emitting cMa complexes chosen from the most promising candidates from above were prepared with dha ranging from 0-65°, their structures and photophysical properties were measured, for M=Cu, Ag and Au. An interim goal was to prepare ≥4 cMa complexes that give $\tau_{TADF}$≤1 μs at dha of 0-10°, 15-30° and 35-50° and measure their photophysical properties.

Next, using the optimal dha, all of the promising blue emissive candidates were prepared in their optimal structures their photophysical properties were measured. An interim goal was to prepare ≥4 blue emissive cMa complexes that give $\tau_{TADF}$≤1 μs and $\Phi_{PL}$≥0.8 using a bidentate ligand at the optimal dha to minimize $\tau_{TADF}$ and measure photophysics.

Finally, OLEDs with all of the strapped cMa complexes with $\tau_{TADF}$<500 ns were tested, focusing on the relative levels of roll-off in efficiency at high brightness and the device lifetimes. An interim goal was to demonstrate EQE≥16% for a blue emissive OLED utilizing a cMa with optimal dha that gives $\tau_{TADF}$<500 ns.

π-Extended Carbenes to Shorten $\tau_{TADF}$

Using symmetric biscarbene (Janus) complexes to fabricate binuclear cMa complexes, $\tau_{TADF}$ values were further decreased relative to the optimized mononuclear cMa complexes. First, binuclear cMa complexes (M=Cu, Ag, Au) with Janus carbenes were prepared choosing appropriate donors to make the Janus-cMa compounds blue emissive and measure their structures and photophysical properties, including $\Phi_{PL}$, $\tau_{TADF}$, $\Delta E_{ST}$ and $\tau_{S_1}$. An interim goal was to prepare ≥4 blue emissive binuclear cMa complexes with Janus carbenes and measure their properties (structure and $\epsilon_{abs}$, $\Phi_{PL}$, $\tau_{TADF}$, $\Delta E_{ST}$, $\tau_{S_1}$).

Next, using the knowledge gained the above tasks, macrocyclic analogs of the Janus carbenes were prepared to decrease $\Delta E_{ST}$ and $\tau_{S_1}$. An interim goal was to prepare macrocyclic analogs of the Janus cMa compounds with the optimal interligand dha determined the tasks above to decrease $\tau_{TADF}$, demonstrating $\Phi_{PL}$≥0.8 and $\tau_{TADF}$<500 ns.

Finally, OLEDs were tested with all of the cMa-Janus carbene complexes that give $\tau_{TADF}$<300 ns, focusing on the roll-off in efficiency at high brightness and the device lifetimes. An interim goal was to test OLEDs with all of the cMa-Janus carbene complexes that give $\tau_{TADF}$<300 ns and to demonstrate blue electroluminescence with an EQE≥18%. Another goal was to demonstrate a WOLED with EQE>18% and color rendering index (CRI)>80.

By testing a statistically significant population of packaged PHOLEDs, WOLED lifetimes at $L_0$=3000 cd/m² of $T_{70}$>50,000 hr were demonstrated using either Ir- or short radiative lifetime TADF molecules in stacked, triplet-managed and graded EML devices.

Purcell Factor Manipulation with Optical Cavity Formation

Figure 14:
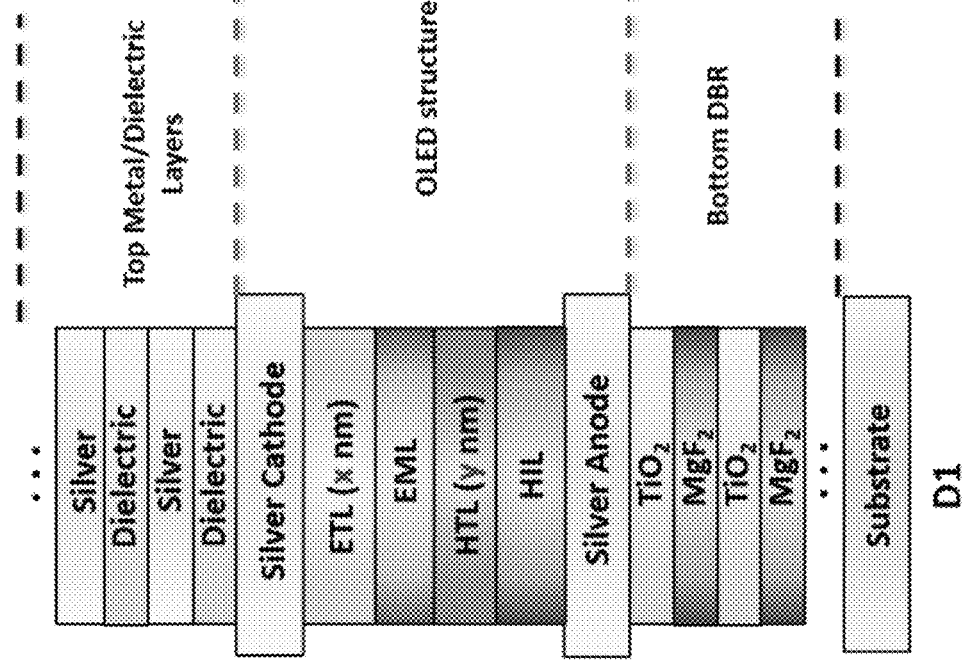
FIG. 14 shows a device structure design and a control device definition.
Figure 15:
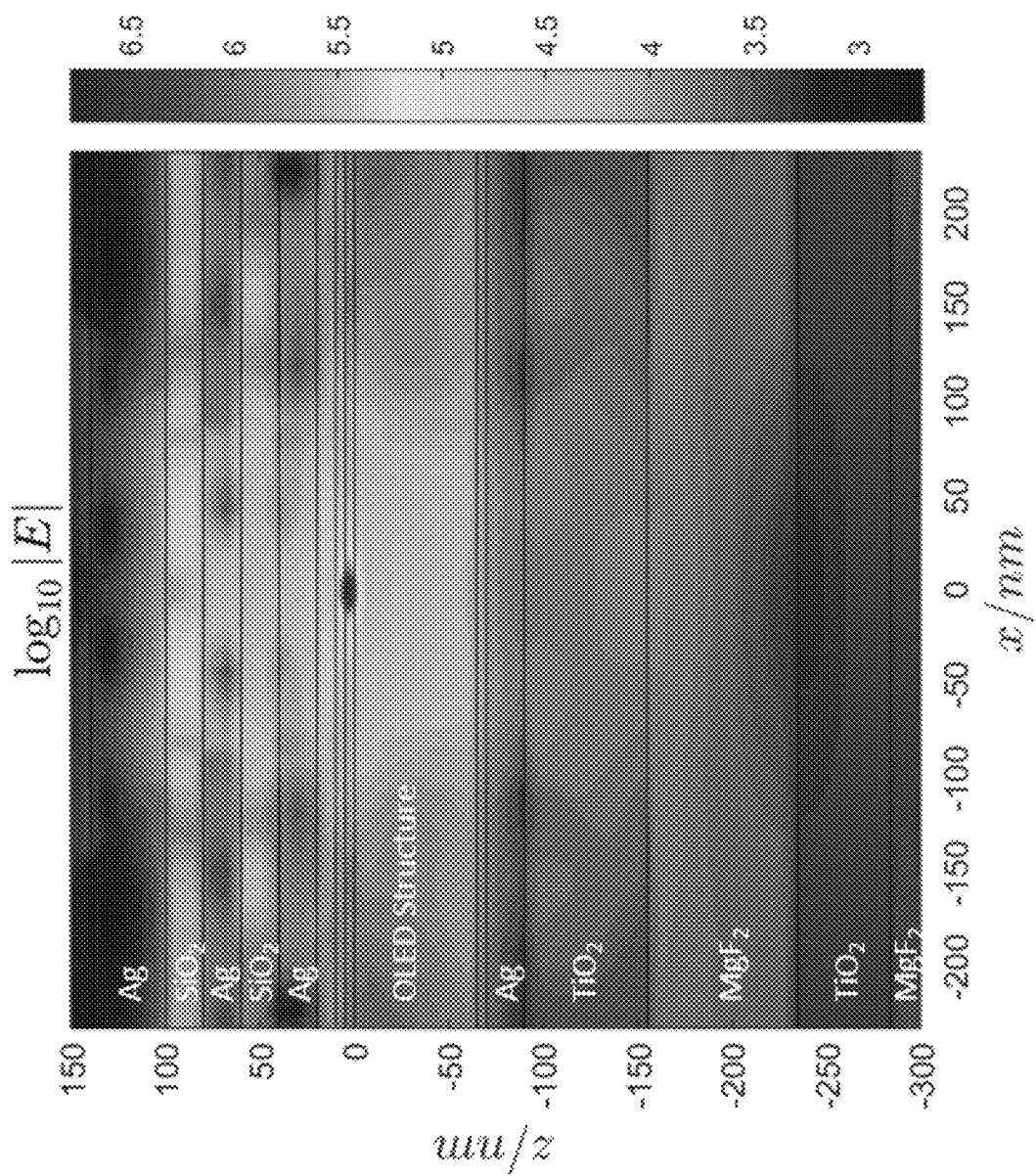
FIG. 15 shows a simulation of exciton field distribution.

An exemplary structure design and control device is shown in 1401 and 1402 in FIG. 14. The top metal/dielectric alternating layers are the main carrier of surface plasmon-polariton (SPP) modes. As shown in FIG. 15, the simulation of the dipole field shows that after penetrating the thin Ag cathode, the electrical field is trapped in the dielectric layer (SiO₂ in this case), interacts with multiple Ag surfaces, and is eventually reflected by the opaque Ag layer back to the device. This structure provides abundant SPP mode coupling and therefore increases the photonic Density of States (DoS). The bottom distributed Bragg reflector (DBR) structure increases the reflectivity of the Ag anode, in assistance with confining the dipole field and thus enhancing the field-dipole interaction.

There are several degrees of freedom for optimization. Due to the interference effect, the dipole position and cavity thickness are the first variables to consider. The thicknesses of the electron transport layer (ETL) and hole transport layer (HTL) are used to vary these parameters. Second, the number of metal/dielectric layers and DBR pairs are highly connected to the control of the cavity effect. A strong cavity effect leads to strong confinement of light at a cost of low outcoupling efficiency, while a weak cavity effect fails to obtain a strong Purcell effect. The analyzed structure is Ag 20 nm/SiO₂ 20 nm/Ag 20 nm/SiO₂ 20 nm/Cathode Ag 20 nm/ETL Alq3 (x) nm/mCBP 5 nm/EML mCBP:Ir(dmp)₃ 5 nm/HTL NPD (y) nm/HIL HATCN 5 nm/Ag 20 nm/TiO₂ 65 nm/MgF₂ 80 nm/TiO₂ 49 nm/MgF₂ 80 nm/Glass substrate.

Purcell Effect Analysis

The Purcell factor in this context is defined as:

$$F_p = \frac{\gamma_r}{\gamma_{r0}} \quad \text{Equation 5}$$

where $\gamma_r$ is the dipole radiative decay rate in a photonic cavity, and $\gamma_{r0}$ is the dipole radiative decay rate in vacuum. For a conventional device with Al/ITO electrodes, the Purcell factor is usually 0.9~1.4 due to less SPP coupling and a more transmissive end on the outcoupling side. In the weak-coupling regime, the dipole radiative decay rate follows Fermi's golden rule:

$$\gamma_r = \frac{\pi \omega}{3 \hbar \varepsilon_0} |\hat{p}|^2 \rho(r_0, \omega) \quad \text{Equation 6}$$

Figures 16A, 16B:
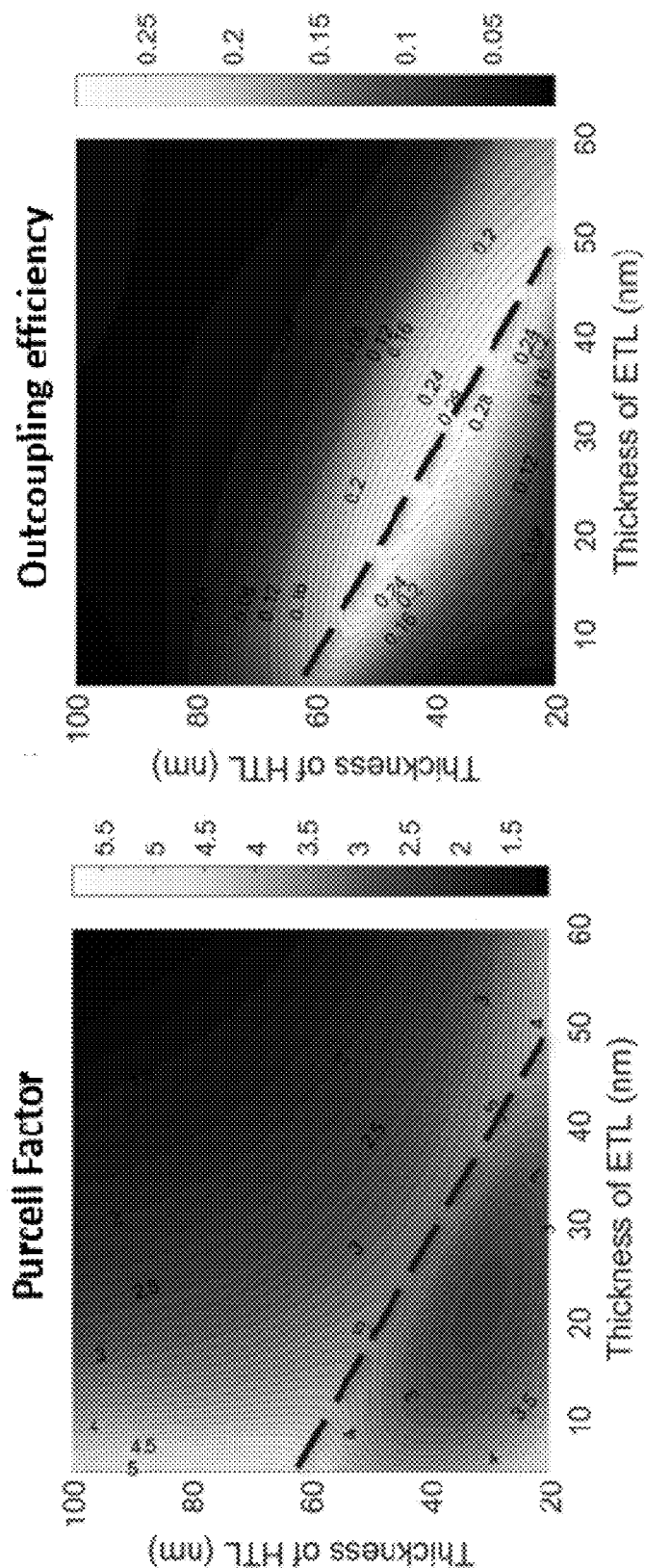
FIG. 16A and FIG. 16B show graphs of simulations of Purcell factor and outcoupling efficiency.

The local density of states (LDOS) is defined as:

$$\rho(r_0, \omega) = \frac{6 \omega n^2}{\pi c^2} \{n_p \cdot G(r_0, r_0; \omega) \cdot n_p\} \quad \text{Equation 7}$$

where $n_p$ is dipole orientation vector, and $G(r_0, r_0; \omega)$ is the local dyadic Green's function. Utilizing dyadic Green's function method, the Purcell factor and outcoupling efficiency were simulated as a function of thicknesses of the ETL and HTL, (on the x and y axes, respectively) as shown in FIG. 16A and FIG. 16B. The Purcell factor (FIG. 16A) decays quickly as the Ag-metal distance increases, indicating the near-field property. The blue dashed line appears at the same position in the Purcell factor and outcoupling efficiency plots, indicating the strongest cavity effect due to interference. In the depicted embodiment, the exciton is embedded at the mCBP/EML interface. With reference to these plots, the outcoupling efficiency and exciton radiative decay rate may be optimized at the same time.

Mode Analysis

Figure 17:
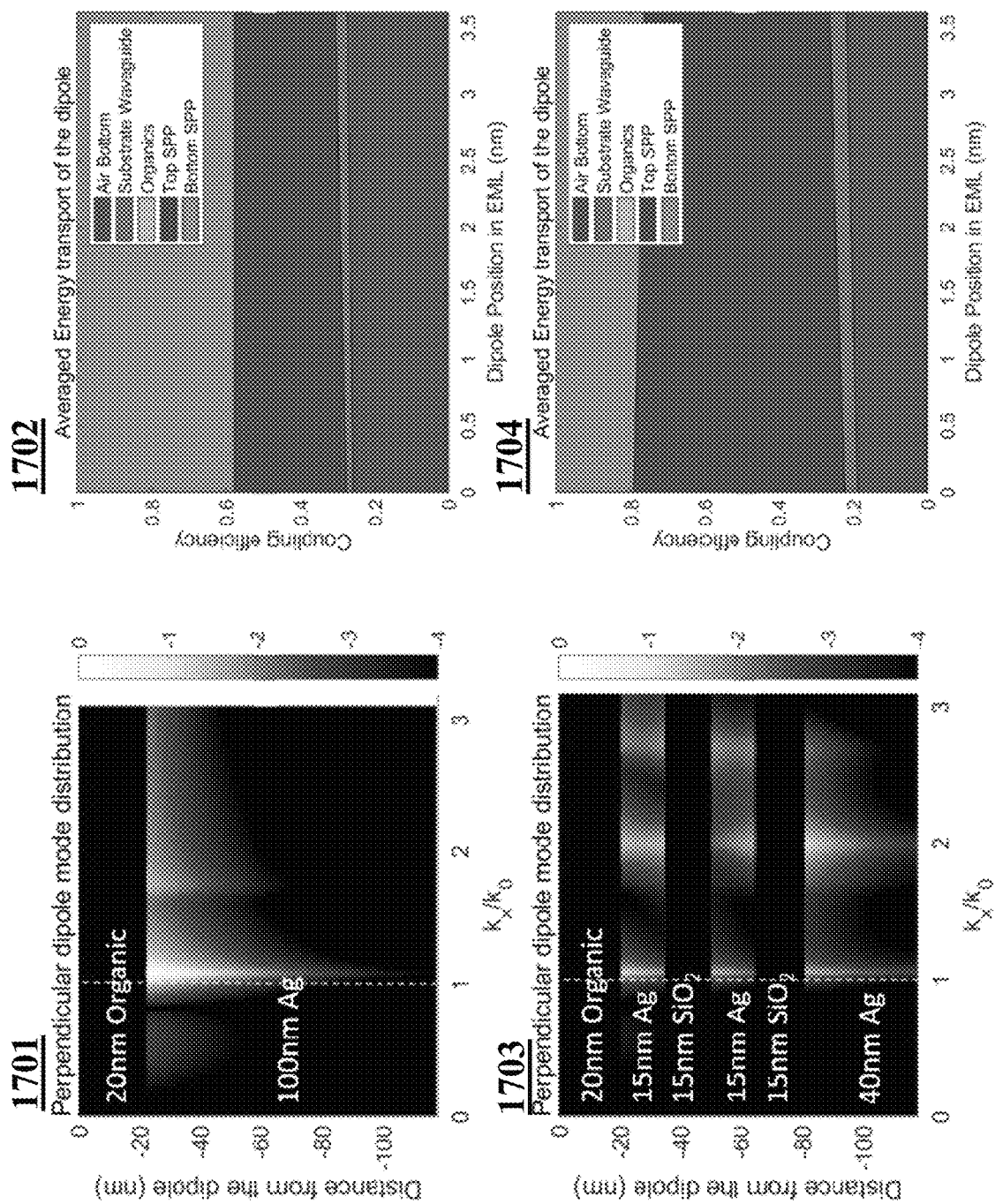
FIG. 17 shows graphs of mode analysis of the application of a top multilayer structure.
Figure 18:
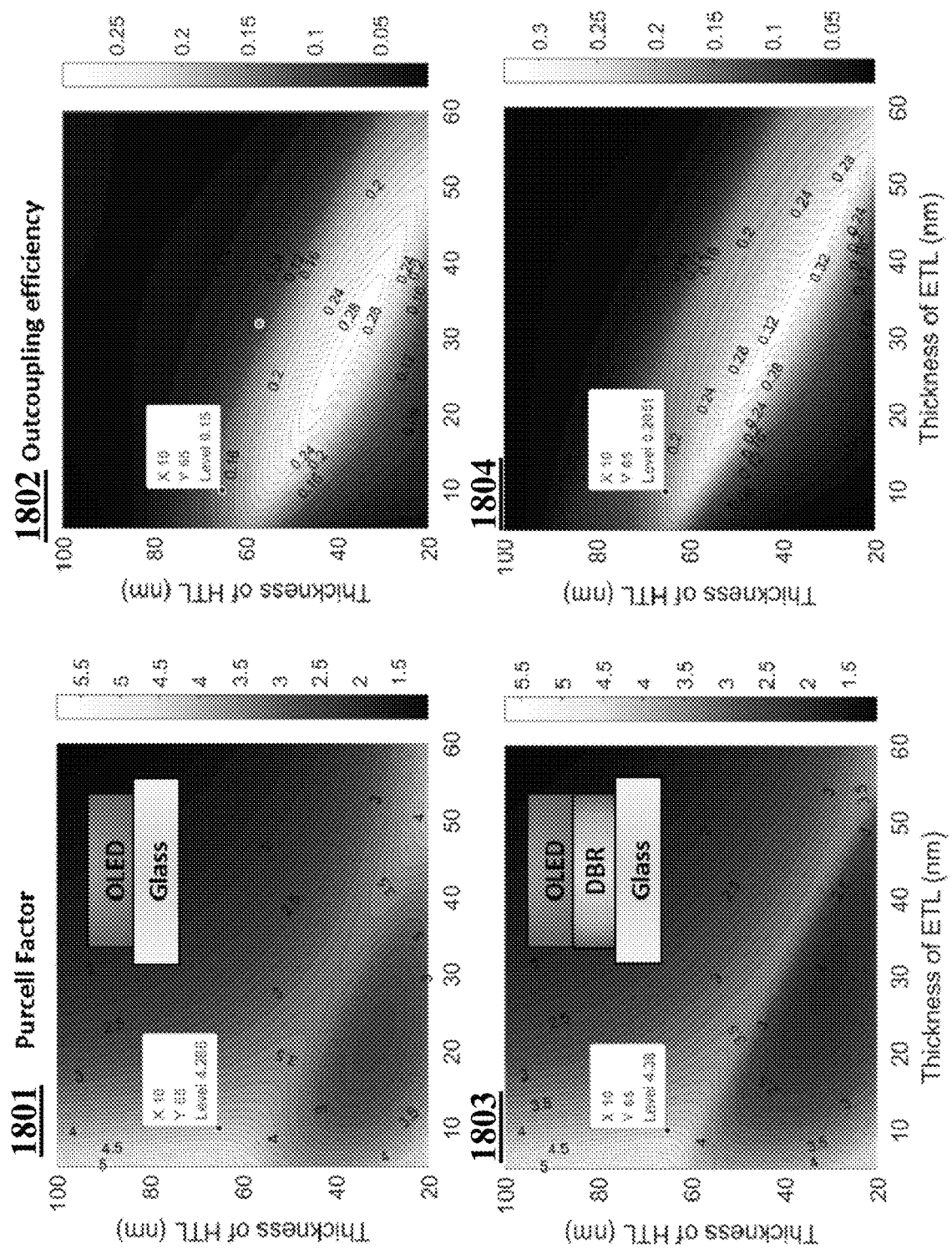
FIG. 18 shows graphs of mode analysis of the application of a bottom multilayer structure.

The effects of top and bottom layers are shown in FIG. 17 and FIG. 18. Graphs 1701 and 1703 show that each Ag surface can individually carry SPP modes. The SPP mode calculation for a single Ag layer and multiple Ag layers spaced by SiO$_2$ layers is shown. SPP modes (with normalized $\widetilde{k}_x$ >1) and waveguided modes are divided by the yellow dashed line; As a result, the top SPP coupling efficiency is almost doubled, while the bottom SPP modes are suppressed, as shown in graphs 1702 and 1704 (corresponding to graphs 1701 and 1703 respectively). Simultaneously, bottom SPP mode coupling (coupling to the Ag anode) becomes less competitive and outcoupling efficiency is reduced. In FIG. 18, adding bottom DBR pairs leads to an increase in outcoupling efficiency without changing the Purcell factor. Graphs 1801 and 1803 show the Purcell factor calculation in the case with and without bottom DBR. As shown, adding DBR barely changes Purcell factor. The corresponding device structures are shown in the insets of graphs 1801 and 1803. The outcoupling efficiency calculation in the case with/without bottom DBR is shown in graphs 1802 and 1804, corresponding to graphs 1801 and 1803, respectively. After inserting DBR at the bottom, the whole outcoupling efficiency contour is elevated by 5%.

Figure 19:
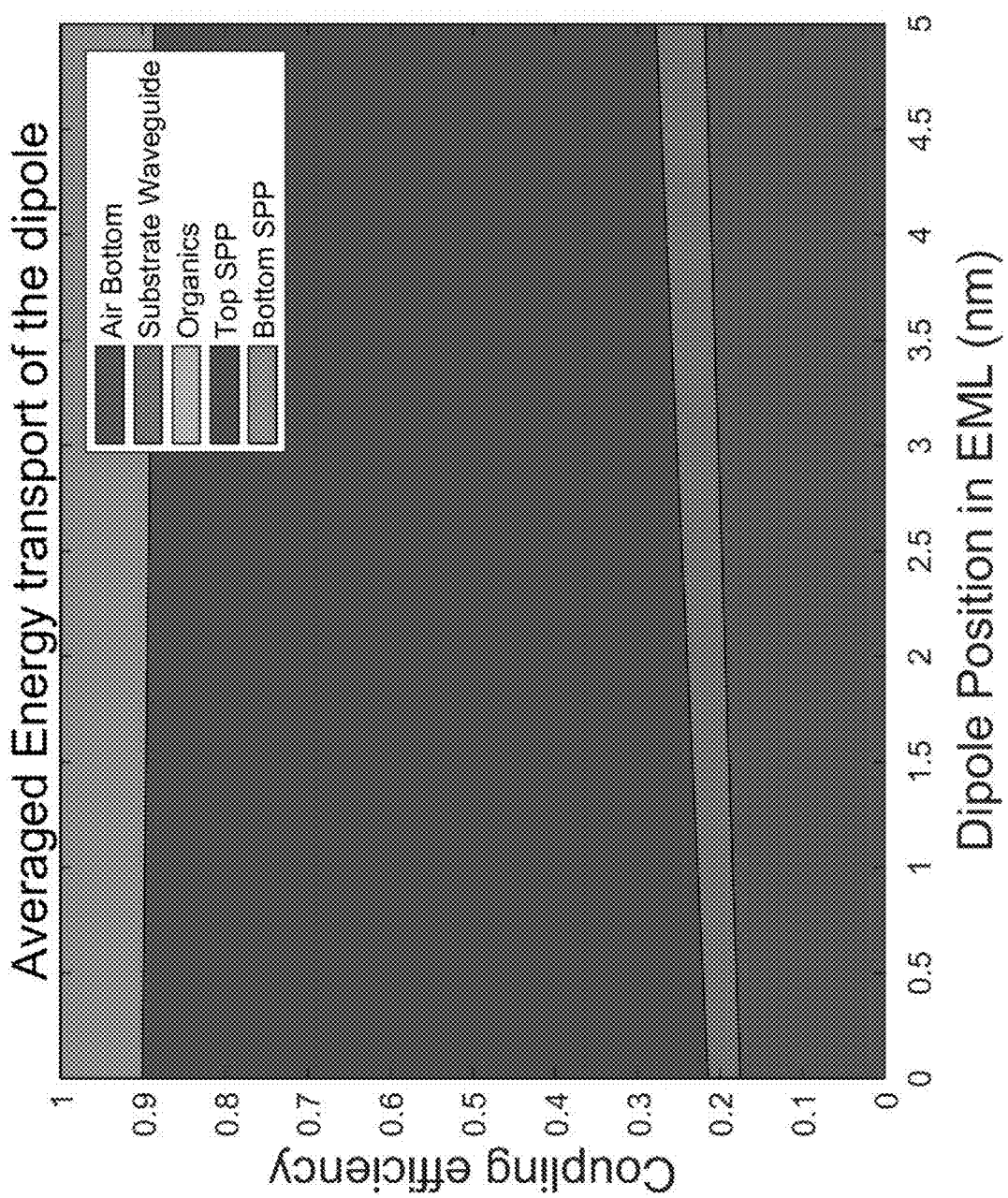
FIG. 19 shows a graph of energy transport of a sample device.

Therefore, top Ag/dielectric layers may be used to enhance the Purcell effect, and adding bottom DBR pairs may compensate for the outcoupling efficiency loss to maintain the same high luminance. Combining these two methods, the full energy transport plot of the disclosed sample device of FIG. 15 is shown in FIG. 19. The sample device achieves a Purcell factor of ~5. The bottom SPP modes and waveguide modes are greatly suppressed, while outcoupling efficiency maintains at ~19%.

Degradation Model

The time evolution of luminance L(t) and trap density Q(t) are modelled using the TPA model, in which the trap formation is assumed due to TPA. Considering charge injection, Langevin recombination, triplet exciton radiative and non-radiative decay, and the interaction related to trap states:

$$G(x) - \gamma n(x, t)p(x, t) - K_{Qn}Q(x, t)n(x, t) = 0 \quad \text{Equation 8}$$

$$G(x) - \gamma n(x, t)p(x, t) - K_{Qp}Q(x, t)p(x, t) = 0 \quad \text{Equation 9}$$

$$\gamma n(x, t)p(x, t) - (F_p(x)\gamma_r + \gamma_{nr} + K_{QN}Q(x, t))N(x, t) = 0 \quad \text{Equation 10}$$

$$\frac{d}{dt}Q(x, t) = K_Q N(x, t)n(x, t) \quad \text{Equation 11}$$

$\gamma = 1.7 \times 10^{-13}$ cm$^3$ s$^{-1}$ is the Langevin recombination rate, $F_P(X)$ is the Purcell factor. G(x) is the local combination rate. $K_{QN}$, $K_Q$ are bimolecular quenching rate and trap formation rate, respectively. The luminance is given by:

$$L(t) = B\int_0^{d_{EML}} N(x,t)\eta_{out}(x)dx \quad \text{Equation 12}$$

Figure 20:
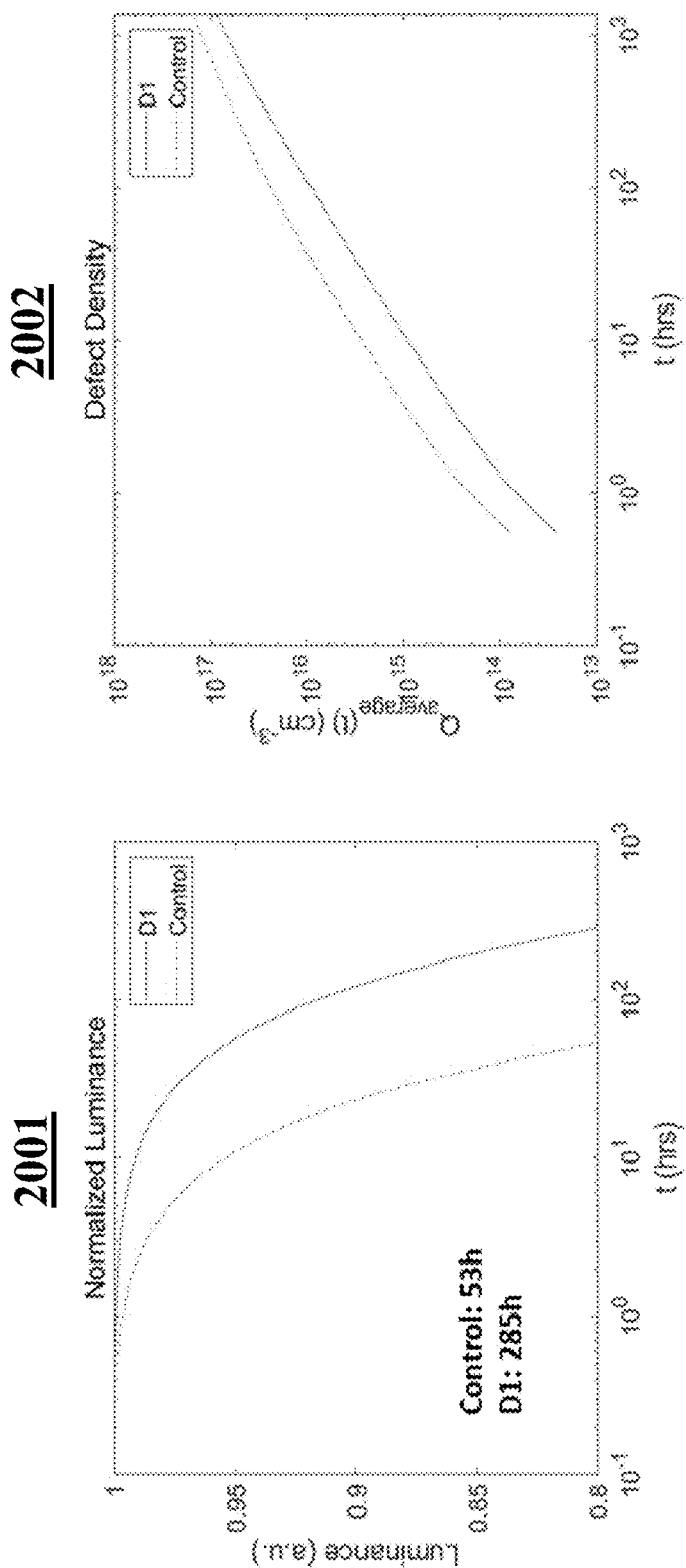
FIG. 20 shows a graph of an operational lifetime analysis.

By numerically solving equation 8-12, graph 2001 of FIG. 20 shows that the disclosed sample device could reach T80=285 h, a fivefold increase compared to the control device. The defect density evolution of D1 and control device is shown in graph 2002. Constants are J=6.2×10$^{-3}$ mA/cm$^2$, $K_Q$=9×10$^{-24}$, $K_{QN}$=1.1×10$^{-11}$, $\tau_0$=1.1 μs$^{-1}$. The PLQY of the dopant molecule is assumed to be 0.6. The control device is assumed to have a Purcell factor ~1.2.

Additional Examples

Additional device structures were simulated using the same methods as in FIG. 16A, FIG. 16B, FIG. 17, and FIG. 18, with the results discussed below.

Figure 21A:
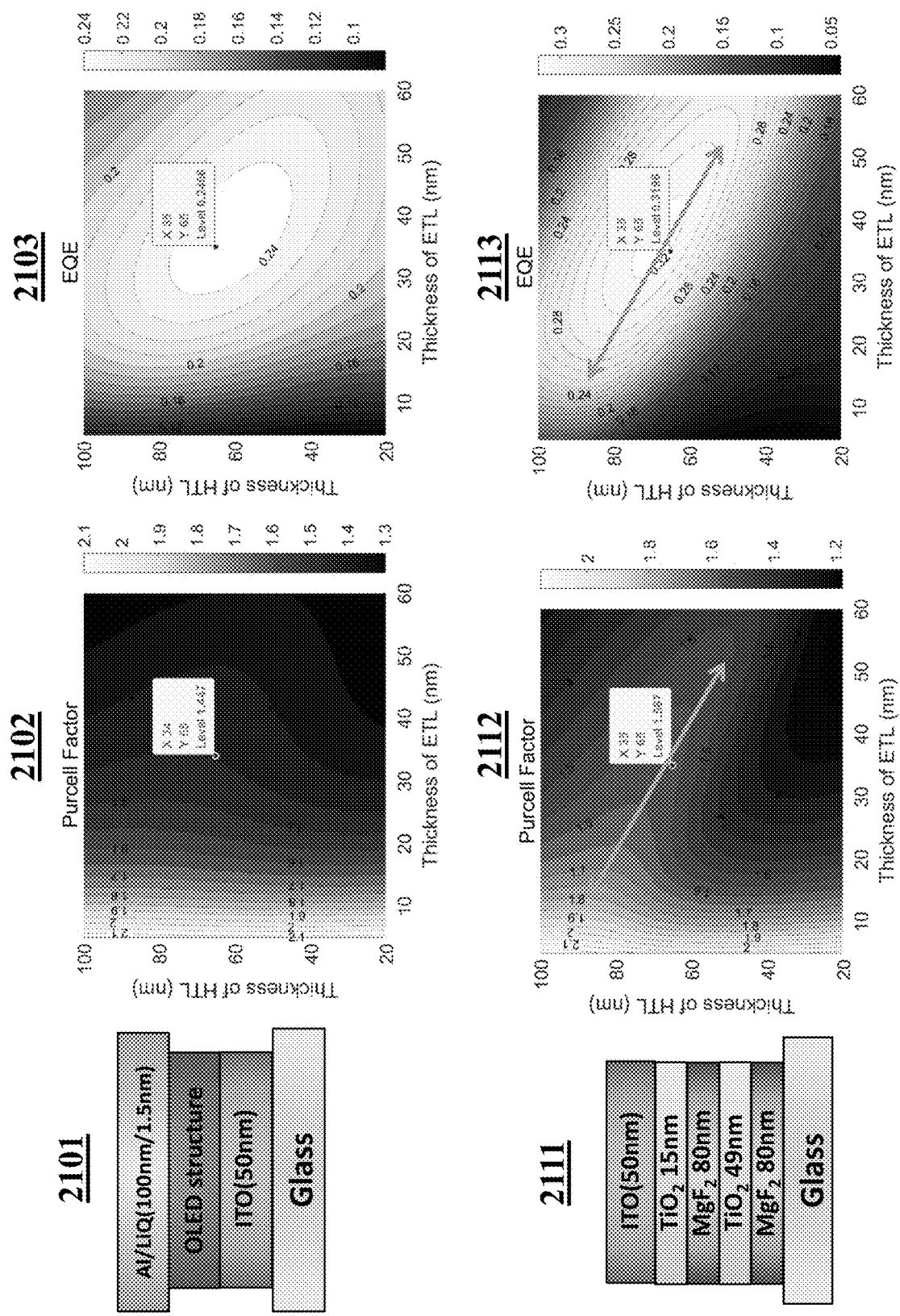
FIG. 21A shows two structures and graphs of corresponding simulated Purcell Factor and EQE calculations.

With reference to FIG. 21A, a first conventional structure 2101 was simulated, varying the thickness of the ETL and the HTL along the x and y axis and calculating the resulting Purcell Factor (2102) and EQE (2103). The results yielded optimum geometry of a 34-35 nm thick ETL and a 65 nm thick HTL, with a resulting Purcell Factor of about 1.4 and an EQE of about 24%.

The second structure 2111 included dielectric layers as shown. Using the same ETL and HTL geometry as in device 2101, the second structure 2111 demonstrated a Purcell Factor (graph 2112) of about 1.6, and an EQE (graph 2113) of 32%. The depicted DBR pairs enhance the resonant effect, and as a result the peaks are stretched along the green arrowed lines in graphs 2112 and 2113. Along the green arrowed lines, the total optical distance of a full circle in the device is fixed.

Figure 21B:
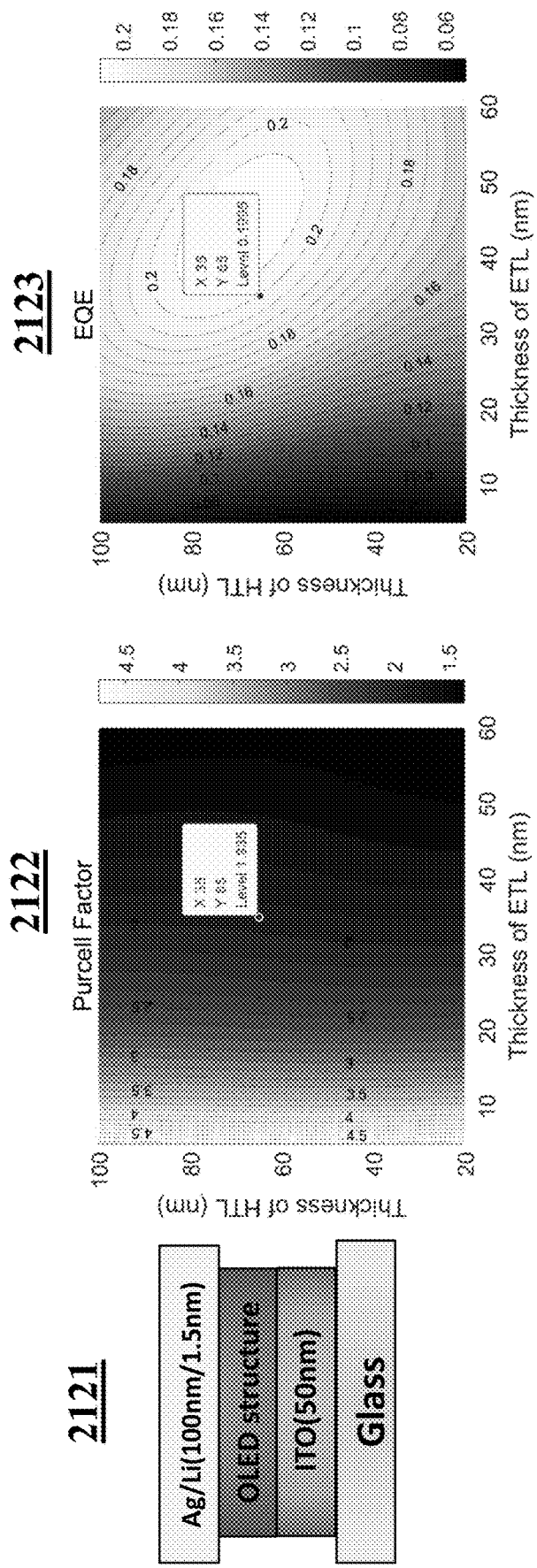
FIG. 21B shows a structure and graphs of corresponding simulated Purcell Factor and EQE calculations.

With reference to FIG. 21B, a second structure 2121 with a silver mirror cathode was simulated, varying the thickness of the ETL and the HTL as above. In the depicted example and with the same geometry, the Purcell factor was about 1.9, with an EQE of 20%.

With reference to FIG. 21C, further metrics of device 2101 and 2121 were simulated and compared. The energy transport plot of device 2101 is shown in graph 2104, while the energy transport plot of device 2121 is shown in graph 2124. Graphs 2105 and 2125 show the perpendicular dipole mode distribution in devices 2101 and 2121, respectively.

With reference to FIG. 21D, structure 2131 includes a double-mirror architecture, including an Ag/Li mirror cathode and a thing Ag:Cu semitransparent anode. The semitransparent anode in the depicted example is formed by growing a silver/copper blend in a continuous surface. The thickness of the ETL and the HTL were varied in the simulation, as above. In the depicted example, with an ETL thickness of 10 nm and an HTL thickness of 65 nm, the Purcell factor was about 4.3, with an EQE of 15%. In another example, with an ETL thickness of 15 nm and an HTL thickness of 50 nm, the Purcell factor was about 3.6, with an EQE of 25%. The peaks in the EQE plot and Purcell Factor enhancement are along the blue line, and the slope of the blue line is –0.9, which is the ratio between the refractive index of Alq3 and NPD.

Structure 2141 includes the same double mirror architecture of structure 2131, with the addition of DBR pairs similar to those in structure 2111. The thickness of the ETL and the HTL were varied in the simulation, as above. In the depicted example, with an ETL thickness of 10 nm and an HTL thickness of 65 nm, the Purcell factor was about 4.3, with an improved EQE of 21%. As shown, the addition of the DBR pairs can increase EQE without significantly affecting Purcell Factor.

Figure 21E:
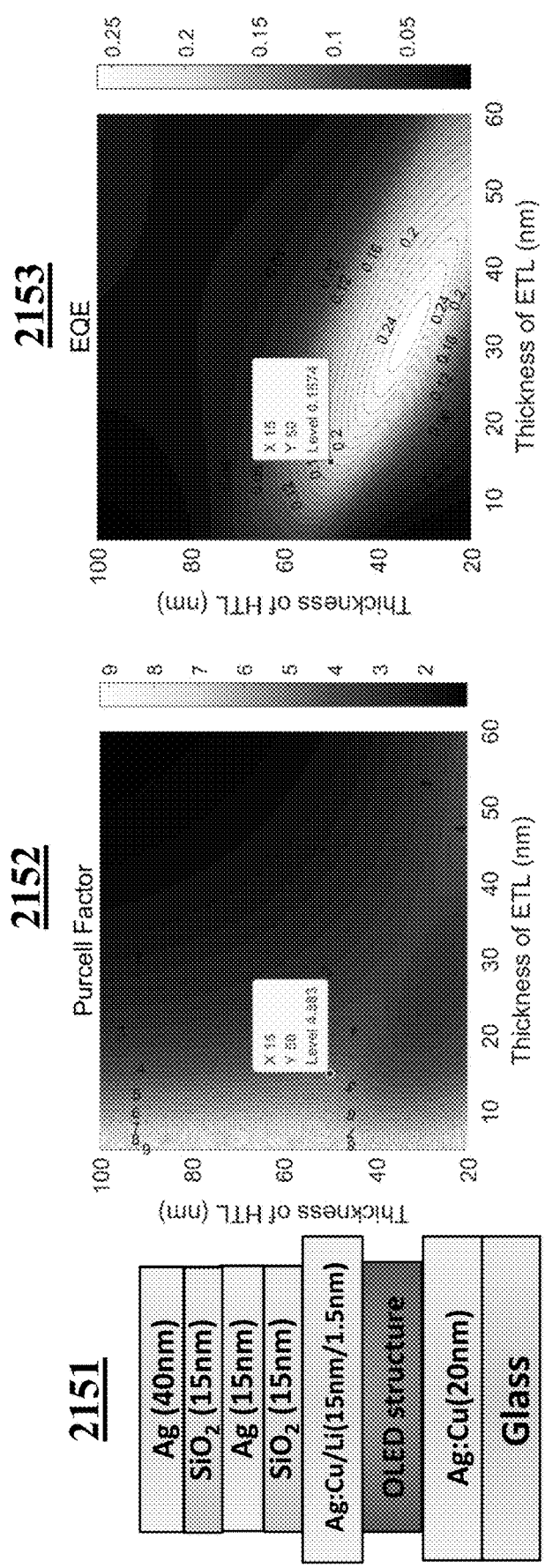
FIG. 21E shows one structure and graphs of corresponding simulated Purcell Factor and EQE calculations.

With reference to FIG. 21E, structure 2151 includes multiple silver layers supporting SPP modes on more interfaces, which can reduce the loss from the electron oscillation damping loss. Because the effective dielectric constant is modified by the dielectric environment, the dispersion relation is changed in this structure. With an ETL thickness of 15 and an HTL thickness of 50, the Purcell Factor was 4.9, with an EQE of 19%.

With reference to FIG. 21F, further metrics of devices 2131 and 2151 were simulated and compared. The energy transport plot of device 2131 is shown in graph 2134, while the energy transport plot of device 2151 is shown in graph 2154. Graphs 2135 and 2136 show the perpendicular and parallel dipole mode distribution in device 2131, while graphs 2155 and 2156 show the perpendicular and parallel dipole mode distribution of device 2151.

Figure 21G:
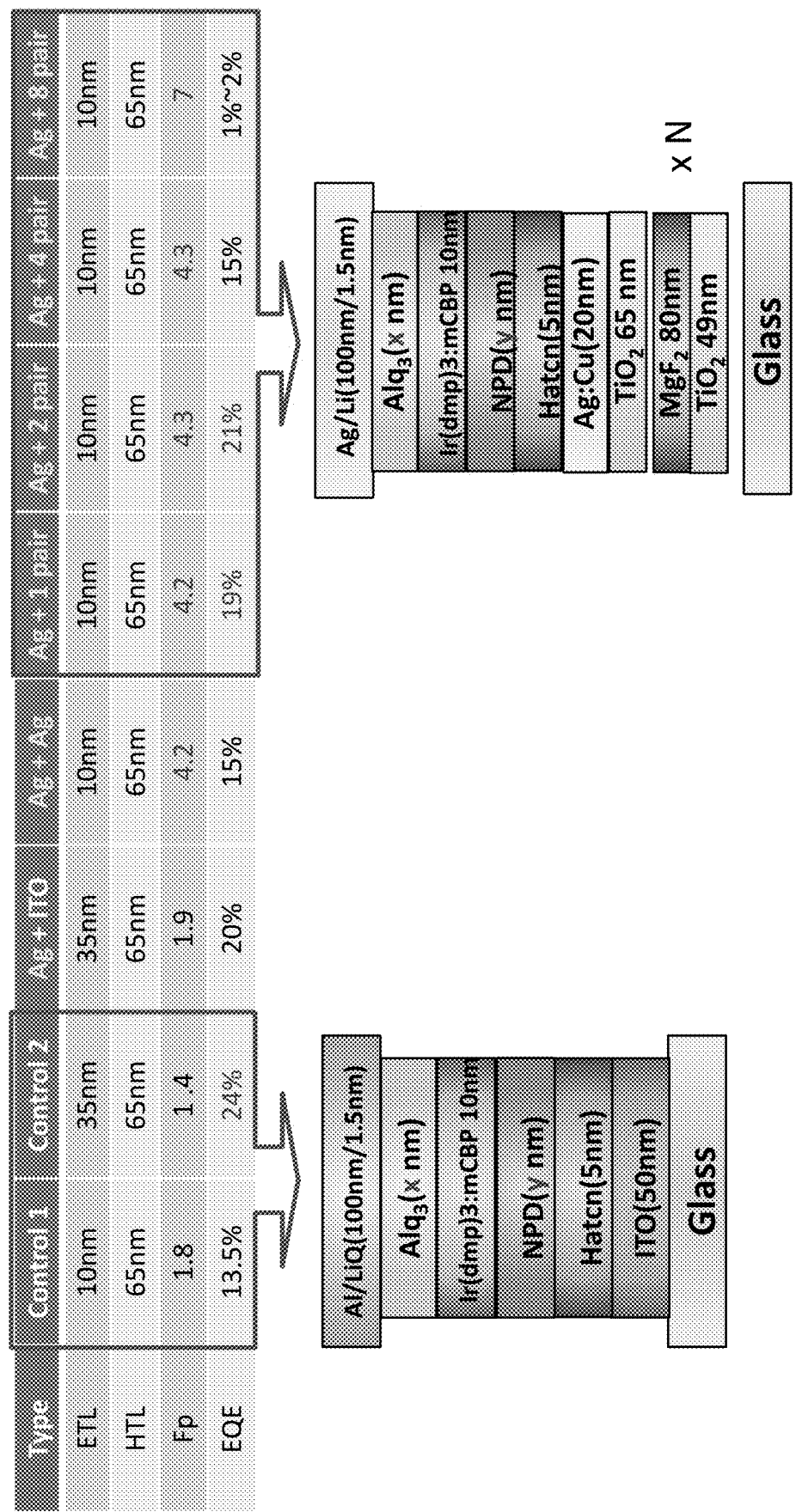
FIG. 21G shows a summary of results from different structures, and two exemplary structures.

A summary of results from different structures is shown in FIG. 21G.

REFERENCES

The following publications are incorporated herein by reference:

Zhang, Y., Lee, J. & Forrest, S. R. Tenfold increase in the lifetime of blue phosphorescent organic light-emitting diodes. *Nat. Commun.* 5, 1-7 (2014).
Lee, J. et al. Hot excited state management for long-lived blue phosphorescent organic light-emitting diodes. *Nat. Commun.* 8, 1-9 (2017).
Sim, B., Moon, C. K., Kim, K. H. & Kim, J. J. Quantitative Analysis of the Efficiency of OLEDs. *ACS Appl. Mater. Interfaces* 8, 33010-33018 (2016).
Celebi, K., Heidel, T. D. & Baldo, M. A. Simplified calculation of dipole energy transport in a multilayer stack using dyadic Green's functions. *Opt. Express* 15, 1762 (2007).
Jeong, C. et al. Understanding molecular fragmentation in blue phosphorescent organic light-emitting devices. *Org. Electron.* 64, 15-21 (2019).
Giebink, N. C. et al. Intrinsic luminance loss in phosphorescent small-molecule organic light emitting devices due to bimolecular annihilation reactions. *J. Appl. Phys.* 103, (2008).
Chance, R. R., Prock, A. & Silbey, R. Molecular Fluorescence and Energy Transfer Near Interfaces. XXXVII, 1-65 (2007).

The disclosures of each and every patent, patent application, and publication cited herein are hereby incorporated herein by reference in their entirety. While this disclosure has been described with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

What is claimed is:

1. An OLED device, comprising:
a substrate;
a first electrode positioned over the substrate;
a second electrode positioned over the first electrode;
at least one emissive layer positioned between the first and second electrodes in a first region of the OLED device;
a multilayer dielectric reflector stack, comprising a plurality of dielectric reflector layers positioned between the substrate and the first electrode; and
a second multilayer dielectric reflector stack positioned over the second electrode, comprising alternating layers of metal and dielectric;
wherein the multilayer dielectric reflector stack and the second multilayer dielectric reflector stack are configured to form an optical cavity with the emissive layer having a Purcell Factor of at least 3.

2. The OLED device of claim 1, further comprising a hole transport layer between the emissive layer and the first electrode.

3. The OLED device of claim 1, further comprising an electron transport layer between the emissive layer and the second electrode.

4. The OLED device of claim 1, wherein the multilayer dielectric reflector stack comprises alternating layers of first and second metal compounds.

5. The OLED device of claim 4, wherein the first metal compound is $TiO_2$ and the second metal compound is $MgF_2$.

6. The OLED device of claim 5, wherein the alternating layers of $TiO_2$ and $MgF_2$ consists of two layers of $TiO_2$ and two layers of $MgF_2$.

7. The OLED device of claim 4, wherein at least one layer of the layers of the first metal compound has a thickness that is different than a thickness of at least one other layer of the layers of the first metal compound.

8. The OLED device of claim 1, wherein the second electrode is a transparent cathode.

9. The OLED device of claim 1, wherein the first electrode is a semitransparent anode.

10. The OLED device of claim 1, wherein the emissive layer is a blue emissive layer.

11. The OLED device of claim 1, further comprising a second region, the second region comprising a second emissive layer having a peak emission wavelength different from a peak emission wavelength of the emissive layer in the first region.

12. The OLED device of claim 11, wherein the peak emission wavelength of the second emissive layer is selected from the group consisting of a red emission wavelength, a green emission wavelength, and a yellow emission wavelength.

13. The OLED device of claim 11, further comprising a diffuser positioned over the second electrode, configured to mix light emitted from the first region and the second region of the OLED device.

14. The OLED device of claim 1, wherein the first electrode is a metal electrode.

15. The OLED device of claim 14, wherein the first electrode comprises silver or aluminum.

16. The OLED device of claim 14, wherein the first electrode has a thickness of 15 nm-20 nm.

17. The OLED device of claim 1, wherein the second electrode is a metal electrode.

18. The OLED device of claim 17, wherein the second electrode comprises silver or aluminum.

19. The OLED device of claim 17, wherein the second electrode has a thickness of 15 nm-20 nm.

* * * * *